(12) United States Patent
Kim

(10) Patent No.: US 11,342,012 B2
(45) Date of Patent: May 24, 2022

(54) ELECTRONIC DEVICES EXECUTING A TERMINATION OPERATION

(71) Applicant: SK hynix Inc., Icheon-si (KR)

(72) Inventor: Woongrae Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/150,776

(22) Filed: Jan. 15, 2021

(65) Prior Publication Data
US 2022/0059145 A1    Feb. 24, 2022

(30) Foreign Application Priority Data

Aug. 21, 2020  (KR) .................. 10-2020-0105560

(51) Int. Cl.
*G11C 7/22* (2006.01)
*H03K 19/00* (2006.01)
*G11C 7/10* (2006.01)

(52) U.S. Cl.
CPC ............ *G11C 7/222* (2013.01); *G11C 7/1045* (2013.01); *G11C 7/1063* (2013.01); *H03K 19/0005* (2013.01)

(58) Field of Classification Search
CPC ..... G11C 7/222; G11C 7/1045; G11C 7/1063; G11C 7/1006; H03K 19/0005
See application file for complete search history.

(56) References Cited

U.S. PATENT DOCUMENTS

| | | | |
|---|---|---|---|
| 8,238,175 B2 | 8/2012 | Fujisawa | |
| 2005/0157585 A1 | 7/2005 | Kato et al. | |
| 2009/0256587 A1* | 10/2009 | Kuboyama | G11C 29/028 326/30 |
| 2012/0113733 A1* | 5/2012 | Kim | G11C 5/063 365/193 |
| 2017/0154668 A1* | 6/2017 | Ha | G11C 29/16 |
| 2020/0204179 A1 | 6/2020 | Lee et al. | |
| 2021/0175887 A1* | 6/2021 | Hiemstra | G11C 7/225 |

FOREIGN PATENT DOCUMENTS

| KR | 101917259 B1 | 1/2019 |
|---|---|---|
| KR | 1020200016043 A | 2/2020 |

* cited by examiner

*Primary Examiner* — Han Yang
(74) *Attorney, Agent, or Firm* — William Park & Associates Ltd.

(57) ABSTRACT

An electronic device includes a termination control circuit and a data input/output (I/O) circuit. The termination control circuit is configured to generate a termination enablement signal which is activated during a termination operation period for activating a termination resistor while a write operation is performed. In addition, the termination control circuit is configured to adjust a period that the termination enablement signal is activated according to whether a write command is inputted to the termination control circuit during a set detection period of the write operation. The data I/O circuit is configured to receive data by activating the termination resistor during a period that the termination enablement signal is activated when the write operation is performed.

20 Claims, 26 Drawing Sheets

| | WL PERIOD | ODT_ON PERIOD | ODT_OFF PERIOD(BL16) | ODT_OFF PERIOD(BL32) |
|---|---|---|---|---|
| ISCD<1> | 8 | 2 | 18 | 26 |
| | 10 | 4 | 20 | 28 |
| | 12 | 4 | 22 | 30 |
| | 14 | 6 | 24 | 32 |
| | 16 | 6 | 26 | 34 |
| | 18 | 8 | 28 | 36 |
| ISCD<2> | 12 | 6 | 22 | 30 |
| | 18 | 12 | 28 | 36 |
| | 22 | 14 | 32 | 40 |
| | 26 | 18 | 36 | 44 |
| | 30 | 20 | 40 | 48 |
| | 34 | 24 | 44 | 52 |

FIG. 6

| | WL PERIOD | ODT_ON PERIOD | ODT_OFF PERIOD(BL16) | ODT_OFF PERIOD(BL32) |
|---|---|---|---|---|
| ISCD<1> | 8 | 2 | 18 | 26 |
| | 10 | 4 | 20 | 28 |
| | 12 | 4 | 22 | 30 |
| | 14 | 6 | 24 | 32 |
| | 16 | 6 | 26 | 34 |
| | 18 | 8 | 28 | 36 |
| ISCD<2> | 12 | 6 | 22 | 30 |
| | 18 | 12 | 28 | 36 |
| | 22 | 14 | 32 | 40 |
| | 26 | 18 | 36 | 44 |
| | 30 | 20 | 40 | 48 |
| | 34 | 24 | 44 | 52 |

US 11,342,012 B2

ELECTRONIC DEVICES EXECUTING A TERMINATION OPERATION

CROSS-REFERENCE TO RELATED APPLICATIONS

The present application claims priority under 35 U.S.C. 119(a) to Korean Application No. 10-2020-0105560, filed on Aug. 21, 2020, which is incorporated herein by reference in its entirety.

BACKGROUND

1. Technical Field

Embodiments of the present disclosure relate to electronic devices executing a termination operation.

2. Related Art

When data or signals are transmitted at high speed in electronic devices, an impedance mismatch phenomenon may occur. The impedance mismatch phenomenon may be solved using a termination circuit. Semiconductor devices among the electronic devices may include an on-die termination circuit to match the mismatched impedance.

SUMMARY

According to an embodiment, an electronic device includes a termination control circuit and a data input/output (I/O) circuit. The termination control circuit is configured to generate a termination enablement signal which is activated during a termination operation period for activating a termination resistor while a write operation is performed. In addition, the termination control circuit is configured to adjust a period that the termination enablement signal is activated according to whether a write command is inputted to the termination control circuit during a set detection period of the write operation. The data I/O circuit is configured to receive data by activating the termination resistor during a period that the termination enablement signal is activated when the write operation is performed.

According to another embodiment, an electronic device includes a termination-on signal generation circuit, a termination-off signal generation circuit, and a termination enablement signal generation circuit. The termination-on signal generation circuit is configured to generate a termination-on signal whenever a write operation is performed. The termination-off signal generation circuit is configured to generate a detection signal and an internal termination-off signal when the write operation is performed and is configured to generate a termination-off signal from the internal termination-off signal based on the detection signal. The termination enablement signal generation circuit is configured to generate a termination enablement signal which is activated during an activation period of a termination resistor based on the termination-on signal and the termination-off signal.

BRIEF DESCRIPTION OF THE DRAWINGS

FIG. 6 is a table illustrating a set-on period and a set-off period which are varied according to a signal generated by an operation information storage circuit included in the mode register illustrated in FIG. 5.

DETAILED DESCRIPTION OF THE EMBODIMENTS

In the description of the following embodiments, when a parameter is referred to as being "predetermined," it may be intended to mean that a value of the parameter is determined in advance of when the parameter is used in a process or an algorithm. The value of the parameter may be set before the process or the algorithm starts or may be set in a period during which the process or the algorithm is executed.

It will be understood that although the terms "first," "second," "third," etc. are used herein to describe various elements, these elements should not be limited by these terms. These terms are only used to distinguish one element from another element. Thus, a first element in some embodiments could be termed a second element in other embodiments without departing from the teachings of the present disclosure, or vice versa.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage may correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment, or vice versa.

Various embodiments of the present disclosure will be described hereinafter in detail with reference to the accompanying drawings. However, the embodiments described herein are for illustrative purposes only and are not intended to limit the scope of the present disclosure.

Figure 1:
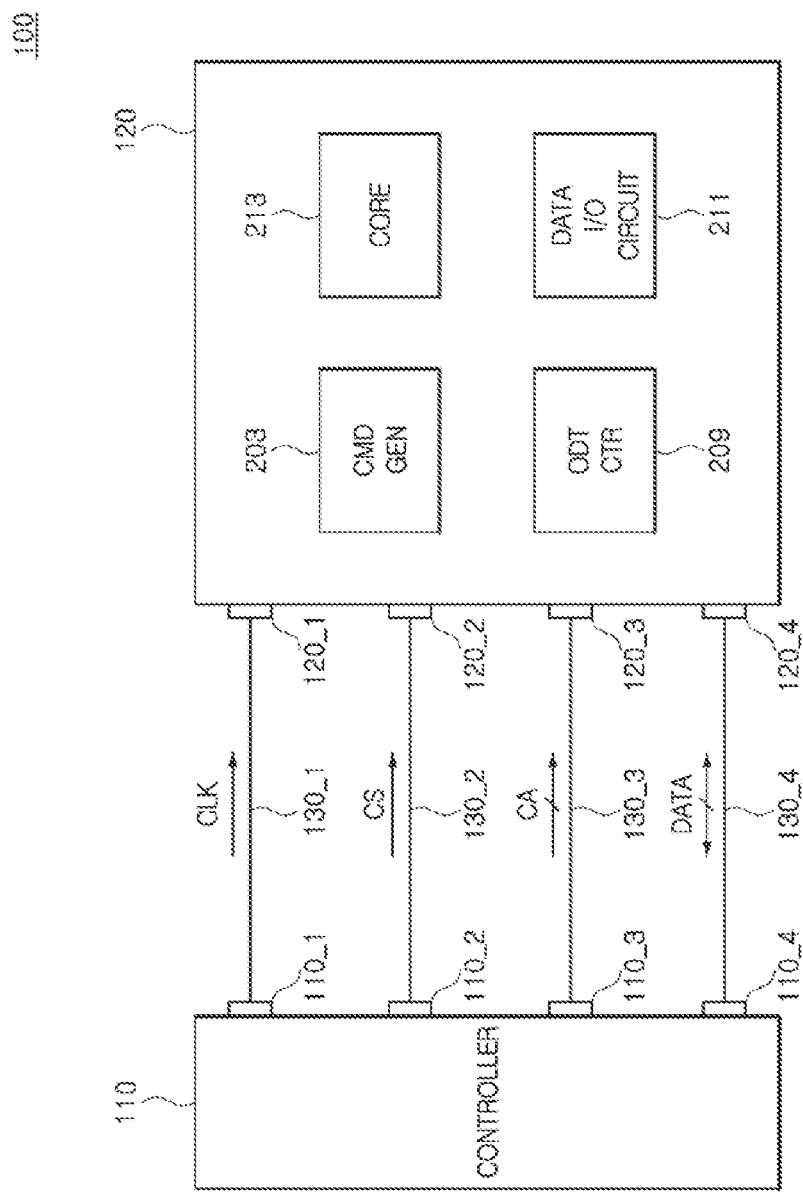
FIG. 1 is a block diagram illustrating a configuration of an electronic system according to an embodiment of the present disclosure.

FIG. 1 is a block diagram illustrating a configuration of an electronic system 100 according to an embodiment of the present disclosure. As illustrated in FIG. 1, the electronic system 100 may include a controller 110 and an electronic device 120.

The controller 110 may include a first control pin 110_1, a second control pin 110_2, a third control pin 110_3, and a fourth control pin 110_4. The electronic device 120 may include a first device pin 120_1, a second device pin 120_2, a third device pin 120_3, and a fourth device pin 120_4. The controller 110 may transmit a clock signal CLK to the electronic device 120 through a first transmission line 130_1 connecting the first control pin 110_1 and the first device pin 120_1 to each other. The controller 110 may transmit a chip selection signal CS to the electronic device 120 through a second transmission line 130_2 connecting the second control pin 110_2 and the second device pin 120_2 to each other. The controller 110 may transmit a command/address signal CA to the electronic device 120 through a third transmission line 130_3 connecting the third control pin 110_3 and the third device pin 120_3 to each other. The controller 110 may transmit data DATA to the electronic device 120 through a fourth transmission line 130_4 connecting the fourth control pin 110_4 and the fourth device pin 120_4 to each other. The controller 110 may receive the data DATA from the electronic device 120 through the fourth transmission line 130_4 connecting the fourth control pin 110_4 and the fourth device pin 120_4 to each other.

The electronic device 120 may include a command generation circuit (CMD_GEN) 203, a termination control circuit (ODT_CTR) 209, a data input/output (I/O) circuit 211, and a core circuit 213. The electronic device 120 may be realized using a semiconductor device. The electronic device 120 may receive the clock signal CLK, the chip selection signal CS, the command/address signal CA, and the data DATA from the controller 110 to perform various internal operations, for example, a termination operation included in a write operation.

The electronic device 120 may include the command generation circuit 203 that generates a write command (WT of FIG. 2) for the write operation based on the chip selection signal CS and the command/address signal CA.

The electronic device 120 may include the termination control circuit 209 that generates a termination enablement signal (ODTEN of FIG. 2) which is activated during the termination operation for activating a termination resistor included in the data I/O circuit 211 while the write operation is performed. The termination control circuit 209 may adjust a period that the termination enablement signal (ODTEN of FIG. 2) is activated according to whether the write command (WT of FIG. 2) is inputted to the termination control circuit 209 during a set detection period of the write operation. Thus, the electronic device 120 may reduce the power consumption of a circuit adjusting a period of the termination operation when the write operation is successively performed.

The electronic device 120 may include the data I/O circuit 211 that receives the data DATA by activating the termination resistor during a period that the termination enablement signal (ODTEN of FIG. 2) is activated when the write operation is performed.

The electronic device 120 may include the core circuit 213 that stores the data DATA into a cell array included in the core circuit 213 when the write operation is performed.

Figure 2:
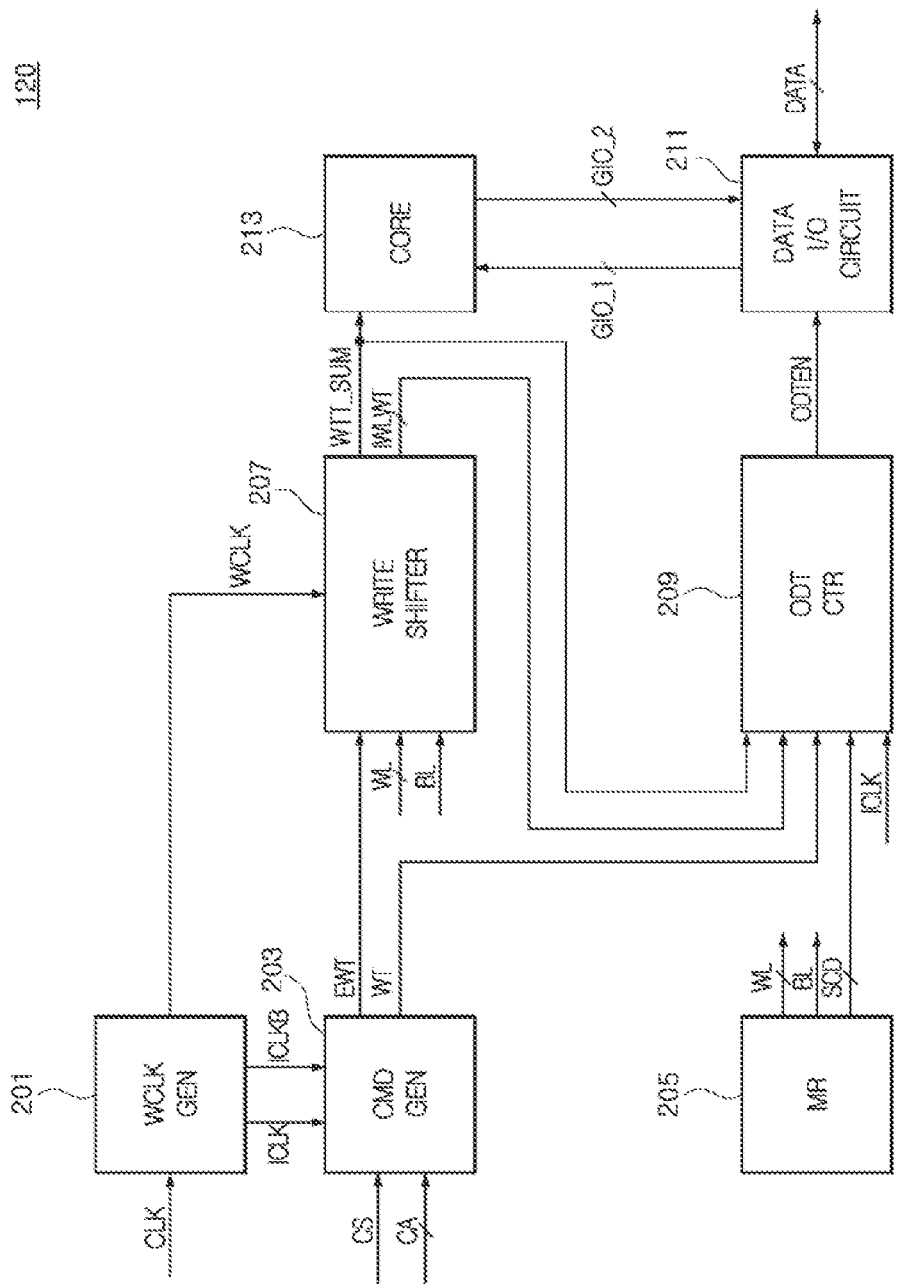
FIG. 2 is a block diagram illustrating a configuration of an electronic device included in the electronic system illustrated in FIG. 1.

FIG. 2 is a block diagram illustrating a configuration of the electronic device 120. As illustrated in FIG. 2, the electronic device 120 may include a write clock generation circuit (WCLK_GEN) 201, the command generation circuit 203, a mode register (MR) 205, a write shift circuit 207, the termination control circuit 209, the data I/O circuit 211, and the core circuit 213.

The write clock generation circuit 201 may generate an internal clock signal ICLK, an inverted internal clock signal ICLKB, and a write clock signal WCLK based on the clock signal CLK. The internal clock signal ICLK may be generated to have the same phase as the clock signal CLK. The inverted internal clock signal ICLKB may be generated to have an opposite phase to the clock signal CLK. The write clock signal WCLK may be generated by dividing a frequency of the clock signal CLK when the write operation is performed. For example, the write dock signal WCLK may be generated to have a frequency which is twice that of the dock signal CLK. The phases of the internal dock signal ICLK, the inverted internal clock signal ICLKB, and the write dock signal WCLK may be set to be different according to the embodiment. Frequencies of the internal dock signal ICLK, the inverted internal dock signal ICLKB, and the write dock signal WCLK may also be set to be different according to the embodiments. An operation of the internal dock generation circuit 201 for generating the internal dock signal ICLK, the inverted internal clock signal ICLKB, and the write dock signal WCLK will be described in more detail with reference to FIG. 3 later.

The command generation circuit 203 may be synchronized with the internal clock signal ICLK and the inverted internal clock signal ICLKB to sequentially generate the write command WT and a write signal EWT based on the based on the chip selection signal CS and the command/address signal CA. The write command WT may be generated from the chip selection signal CS and the command/address signal CA having a logic level combination for the write operation. The write signal EWT may be generated by delaying the write command WT by a certain period in synchronization with the internal clock signal ICLK and the inverted internal clock signal ICLKB. The number of bits included in the command/address signal CA may be set to be different according to the embodiments. An operation and a configuration of the command generation circuit 203 will be described in more detail with reference to FIG. 4 later.

The mode register 205 may output a write latency signal WL, a burst length signal BL, and a set code SCD. The mode register 205 may store the write latency signal WL, the burst length signal BL, and an internal set code (ISCD of FIG. 5) therein. The write latency signal WL may include bits corresponding to respective ones of various periods of a write latency period. The write latency period may be set as a period from a point in time when the write command WT is activated until a point in time when the data I/O circuit 211 receives the data DATA when the write operation is performed. For example, a seventeenth write latency signal WL<34> may be activated when the write latency period is set to be 34 cycles of the clock signal CLK, and a sixteenth write latency signal WL<32> may be activated when the write latency period is set to be 32 cycles of the clock signal CLK. The burst length signal BL may have a logic level corresponding to a burst length. The burst length may include a first burst length and a second burst length. For example, the burst length signal BL may be inactivated to have a logic "low" level when the burst length is set as the first burst length, and the burst length signal BL may be activated to have a logic "high" level when the burst length is set as the second burst length. The internal set code (ISCD of FIG. 5) may be generated to set a set-on period for entering the termination operation and a set-off period for terminating the termination operation during the write operation. The set-on period may be set as a period from a point in time when the write command WT is activated until a point in time when the termination operation is activated when the write operation is performed. The set-on period may vary according to the write latency period and a logic level combination of the internal set code (ISCD of FIG. 5). The set-off period may be set as a period from a point in time when the write command WT is activated until a point in time when the termination operation is terminated when the write operation is performed. The set-off period may vary according to the write latency period, the burst length, and a logic level combination of the internal set code (ISCD of FIG. 5). The set code SCD may be generated according to a difference between the write latency period and the set-on period. The mode register 205 may output the set code SCD which is activated when a difference between the write latency period and the set-on period is a set standby period. The write latency period may be set to be greater than the set-on period. For example, a first bit SCD<1> of the set code SCD may be activated when a difference between the write latency period and the set-on period is equal to a first set standby period, and a second bit SCD<2> of the set code SCD may be activated when a difference between the write latency period and the set-on period is equal to a second set standby period. Similarly, a third bit SCD<3> of the set code SCD may be activated when a difference between the write latency period and the set-on period is equal to a third set standby period. A configuration and an operation of the mode register 205 will be described in more detail with reference to FIG. 5 later.

The write shift circuit 207 may delay the write signal EWT based on the write latency signal WL and the burst length signal BL in synchronization with the write clock signal WCLK, thereby generating an internal latency write signal IWLWT including a plurality of bits and a synthesis write flag signal WTT_SUM. The write shift circuit 207 may delay the write signal EWT by a period less than the write latency period based on the write latency signal WL in synchronization with the write clock signal WCLK, thereby sequentially generating the internal latency write signal IWLWT including a plurality of bits. The write shift circuit 207 may delay the write signal EWT by a period less than the write latency period by the first set standby period in synchronization with the write clock signal WCLK, thereby generating a third internal latency write signal IWLWT_6. The write shift circuit 207 may delay the write signal EWT by a period less than the write latency period by the second set standby period in synchronization with the write clock signal WCLK, thereby generating a fourth internal latency write signal IWLWT_8. The write shift circuit 207 may delay the write signal EWT by a period less than the write latency period by the third set standby period in synchronization with the write clock signal WCLK, thereby generating a fifth internal latency write signal IWLWT_10. That is, the third, fourth, and fifth internal latency write signals IWLWT_6, IWLWT_8, and IWLWT_10 may be activated at a point in time when the set-on period terminates. The write shift circuit 207 may delay the write signal EWT by the write latency period based on the write latency signal WL in synchronization with the write clock signal WCLK, thereby generating a latency write signal (WLWT of FIG. 9). The write shift circuit 207 may delay the latency write signal (WLWT of FIG. 9) by a burst length period based on the burst length signal BL in synchronization with the write dock signal WCLK, thereby generating the synthesis write flag signal WTT_SUM. The burst length period may be set to be a period including "L/2" times a cycle of the dock signal CLK when the burst length is set as "L" (where, "L" may be set as a natural number which is equal to or greater than two). The synthesis write flag signal WTT_SUM may be generated by delaying the write signal EWT by the write latency period and the burst period length, A configuration and an operation of the write shift circuit 207 will be described in more detail with reference to FIG. 9 later.

The termination control circuit 209 may be synchronized with the internal dock signal ICLK to generate the termination enablement signal ODTEN based on the write command WT, the plurality of internal latency write signals IWLWT, the synthesis write flag signal WTT_SUM, and the set code SCD when the write operation is performed. The write operation may include a first write operation and a second write operation. The second write operation may be successively performed after the first write operation is performed. The termination enablement signal OATEN may be activated during a period of the termination operation for activating the termination resistor included in the data I/O circuit 211 while the write operation is performed. The termination operation period may be set as a period from a point in time when a termination-on signal (ODT_ON of FIG. 12) is activated until a point in time when an internal termination-off signal (IODT_OFF of FIG. 14) is activated when the write operation is performed. For example, the termination operation period of the first write operation may be set as a period from a point in time when the termination-on signal (ODT_ON of FIG. 12) is activated during the first write operation until a point in time when the internal termination-off signal (IODT_OFF of FIG. 14) is activated during the first write operation. The termination operation period of the second write operation may be set as a period from a point in time when the termination-on signal (ODT_ON of FIG. 12) is activated during the second write operation until a point in time when the internal termination-off signal (IODT_OFF of FIG. 14) is activated during the second write operation. The termination control circuit 209 may output one of the plurality of internal latency write signals IWLWT as the termination-on signal (ODT_ON of FIG. 12) based on the set code SCD. For example, the termination control circuit 209 may output the third internal latency write signal IWLWT_6 as the termination-on signal (ODT_ON of FIG. 12) when the first bit SCD<1> of the set code is activated. The termination control circuit 209 may output the fourth internal latency write signal IWLWT_8 as the termination-on signal (ODT_ON of FIG. 12) when the second bit SCD<2> of the set code is activated. The termination control circuit 209 may output the fifth internal latency write signal IWLWT_10 as the termination-on signal (ODT_ON of FIG. 12) when the third bit SCD<3> of the set code is activated. That is, the termination-on signal (ODT_ON of FIG. 12) may be activated at a point in time when the set-on period is terminated by delaying the write signal EWT by a period less than the write latency period by an entry standby period. The termination control circuit 209 may delay the synthesis write flag signal WTT_SUM by an end delay period to generate the internal termination-off signal (IODT_OFF of FIG. 14). The end delay period may be set as a period from a point in time when the synthesis write flag signal WTT_SUM is activated until a point in time when the set-off period is terminated. That is, the internal termination-off signal (IODT_OFF of FIG. 14) may be generated by delaying the write signal EWT by a period including the write latency period and the burst length period to be activated at a point in time when the set-off period is terminated. The termination control circuit 209 may adjust an activation period of the termination enablement signal ODTEN according to whether the write command WT for the write operation is inputted to the termination control circuit 209 during the set detection period of the write operation. The set detection period may be set as a period from a point in time when the write command WT for the write operation is activated until a point in time when the internal termination-off signal (IODT_OFF of FIG. 14) is activated during the write operation. For example, the set detection period of the first write operation may be set as a period from a point in time when the write command WT for the first write operation is activated until a point in time when the internal termination-off signal (IODT_OFF of FIG. 14) is activated during the first write operation. The set detection period of the second write operation may be set as a period from a point in time when the write command WT for the second write operation is activated until a point in time when the internal termination-off signal (IODT_OFF of FIG. 14) is activated during the second write operation. The termination control circuit 209 may maintain the activation period of the termination enablement signal ODTEN when the write command WT for the write operation is not inputted to the termination control circuit 209 during the set detection period of the write operation. The termination control circuit 209 may adjust the activation period of the termination enablement signal ODTEN to be longer until a point in time when the internal termination-off signal (IODT_OFF of FIG. 14) is activated during the second write operation, when the write command WT for the second write operation is inputted to the termination control circuit 209 during the set detection period of the first write operation. Thus, the termination control circuit 209 may generate the termination enablement signal ODTEN which is activated during the termination operation period for activating the termination resistor when the write operation is performed and may adjust a period that the termination enablement signal ODTEN is activated according to whether the write command WT is inputted to the termination control circuit 209 during the set detection period of the write operation. Accordingly, the electronic device 120 may reduce the power consumption of a circuit adjusting the termination operation period when the write operation is successively performed. The termination control circuit 209 may generate the termination enablement signal ODTEN based on the termination-on signal (ODT_ON of FIG. 12) and the internal termination-off signal (IODT_OFF of FIG. 14). A configuration and an operation of the termination control circuit 209 will be described in more detail with reference to FIG. 12 later.

The data I/O circuit 211 may output the data DATA, which are received from the controller (110 of FIG. 1), to the core circuit 213 through an input line GIO_1 when the write operation is performed. The data I/O circuit 211 may output the data DATA, which are received from the core circuit 213, to the controller (110 of FIG. 1) through an output line GIO_2 when the read operation is performed. The data I/O circuit 211 may activate the termination resistor to receive the data DATA during the activation period of the termination enablement signal ODTEN when the write operation is performed. The data I/O circuit 211 may include the termination resistor. A configuration and an operation of the data I/O circuit 211 will be described in more detail with reference to FIG. 19 later.

The core circuit 213 may store the data DATA, which are received from the data I/O circuit 211 through the input line GIO_1, when the synthesis write flag signal WTT_SUM is activated during the write operation. The core circuit 213 may output the data DATA, which are stored therein, to the data I/O circuit 211 through the output line GIO_2 when the read operation is performed.

Figure 3:
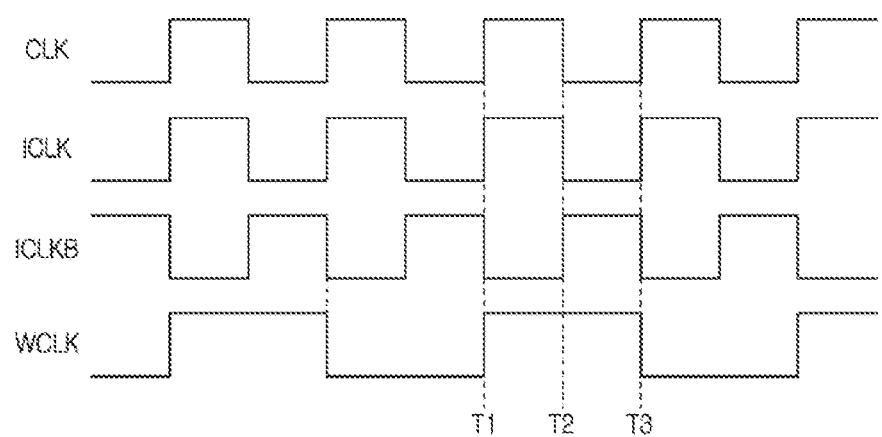
FIG. 3 is a timing diagram illustrating an operation of a write dock generation circuit included in the electronic device illustrated in FIG. 2.

FIG. 3 is a timing diagram illustrating an operation of the write clock generation circuit 201. Referring to FIG. 3, the write clock generation circuit 201 may generate the internal clock signal ICLK having the same phase as the clock signal CLK. The write clock generation circuit 201 may be synchronized with a rising edge of the clock signal CLK at a point in time "T1" to generate the internal clock signal ICLK which is toggled from a logic "low" level into a logic "high" level. The write clock generation circuit 201 may generate the inverted internal clock signal ICLKB having an opposite phase to the clock signal CLK. The write clock generation circuit 201 may be synchronized with a falling edge of the clock signal CLK at a point in time "T2" to generate the inverted internal clock signal ICLKB which is toggled from a logic "low" level into a logic "high" level. The write dock generation circuit 201 may generate the write clock signal WCLK having a cycle which is twice a cycle of the dock signal CLK. The write dock generation circuit 201 may generate the write dock signal WCLK which is toggled from a logic "low" level into a logic "high" level in synchronization with a rising edge of the dock signal CLK at the point in time "T1" and which is toggled from a logic "high" level into a logic "low" level in synchronization with a rising edge of the clock signal CLK at a point in time "T3".

Figure 4:
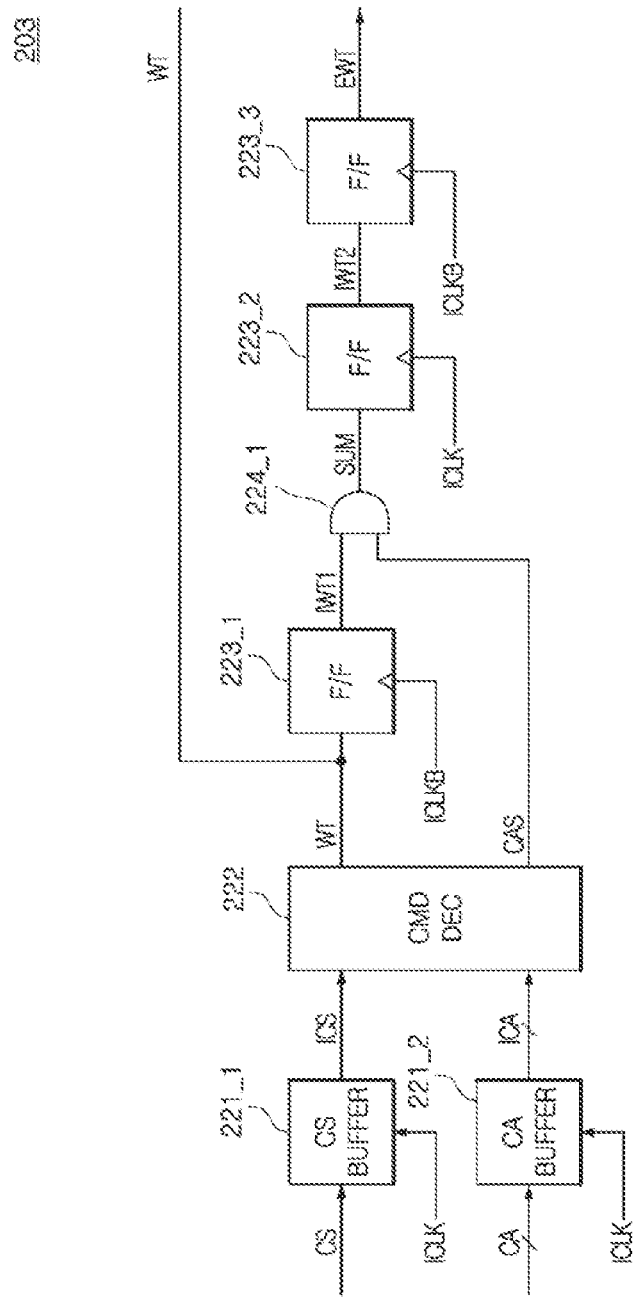
FIG. 4 illustrates a configuration of a command generation circuit included in the electronic device illustrated in FIG. 2.

FIG. 4 illustrates a configuration of the command generation circuit 203. As illustrated in FIG. 4, the command generation circuit 203 may include a first buffer circuit (CS_BUFFER) 221_1, a second buffer circuit (CA_BUFFER) 221_2, a command decoder (CMD_DEC) 222, flip-flops 223_1, 233_2, and 223_3, and an AND gate 224_1.

The first buffer circuit 221_1 may buffer the chip selection signal CS in synchronization with the internal clock signal ICLK to generate and output an internal chip selection signal ICS. The second buffer circuit 221_2 may buffer the command/address signal CA in synchronization with the internal clock signal ICLK to generate and output an internal command/address signal ICA. The command decoder 222 may decode the internal chip selection signal ICS and the internal command/address signal ICA to generate the write command WT and a column address strobe (CAS) command CAS. The write command WT may be generated from the internal chip selection signal ICS and the internal command/address signal ICA having logic levels for performing the write operation. The CAS command CAS may be activated to generate a column address for storing the data DATA into a cell array (not shown) of the core circuit 213 when the write operation is performed. The flip-flop 223_1 may delay the write command WT by one cycle of the clock signal CLK in synchronization with the inverted internal clock signal ICLKB to generate and output a first internal write signal IWT1. The AND gate 224_1 may buffer the first internal write signal IWT1 to generate and output a synthesis signal SUM when the CAS command CAS is activated to have a logic "high" level. The flip-flop 223_2 may delay the synthesis signal SUM by one cycle of the clock signal CLK in synchronization with the internal clock signal ICLK to generate and output a second internal write signal IWT2. The flip-flop 223_3 may delay the second internal write signal IWT2 by one cycle of the clock signal CLK in synchronization with the inverted internal clock signal ICLKB to generate and output the write signal EWT.

Figure 5:
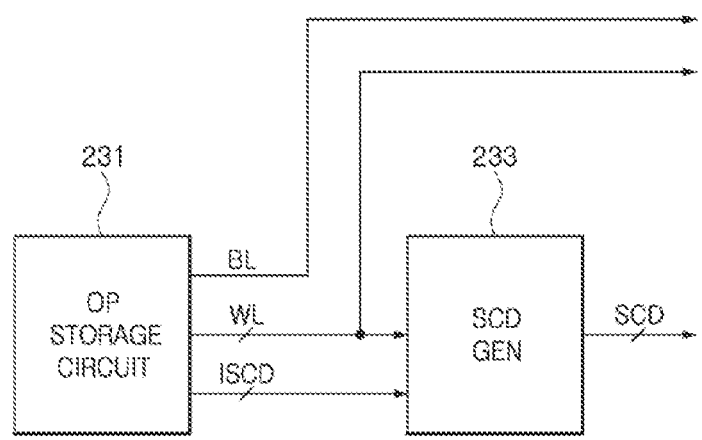
FIG. 5 is a block diagram illustrating a configuration of a mode register included in the electronic device illustrated in FIG. 2.

FIG. 5 is a block diagram illustrating a configuration of the mode register 205. As illustrated in FIG. 5, the mode register 205 may include an operation information storage circuit (OP_STORAGE_CIRCUIT) 231 and a set code generation circuit (SCD_GEN) 233.

The operation information storage circuit 231 may store the write latency signal WL including a plurality of bits, the burst length signal BL, and the internal set code ISCD. The operation information storage circuit 231 may output the write latency signal WL, the burst length signal BL, and the internal set code ISCD. The bits of the write latency signal WL may correspond to respective ones of various periods of the write latency period. For example, an $M^{th}$ write latency signal WL<2M> of the write latency signal WL may be activated when the write latency period is set to have a period which is "2M" times a cycle of the clock signal CLK (where, "M" may be set as a natural number), The burst length signal BL may have a logic level corresponding to a burst length. For example, the $M^{th}$ write latency signal WL<2M> of the write latency signal WL may be inactivated to have a logic "low" level when the burst length is set to be "16" and may be activated to have a logic "high" level when the burst length is set to be "32". The internal set code ISCD may be generated to define the set-on period for entering the termination operation during the write operation and the set-off period for terminating the termination operation during the write operation. The set-on period may be set as a period from a point in time when the write command (WT of FIG. 2) is activated until a point in time when the termination operation is activated when the write operation is performed. The set-on period may vary according to a logic level combination of the write latency signal WL and the internal set code ISCD. The set-off period may be set as a period from a point in time when the write command (WT of FIG. 2) is activated until a point in time when the termination operation is terminated when the write operation is performed. The set-off period may vary according to a logic level combination of the write latency signal WL, the burst length signal BL, and the internal set code ISCD. The set-on period and the set-off period varying according to the signals generated by the operation information storage circuit 231 will be described in more detail with reference to FIG. 6 later.

The set code generation circuit 233 may generate the set code SCD according to a logic level combination of the write latency signal WL and the internal set code ISCD. The set code generation circuit 233 may generate the set code SCD according to a difference between the write latency period and the set-on period. The set code generation circuit 233 may generate the set code SCD which is activated when the difference between the write latency period and the set-on period corresponds to the set standby period. The write latency period may be set to be greater than the set-on period. In an embodiment, a first bit SCD<1> of the set conde SCD may be activated when the difference between the write latency period and the set-on period corresponds to a first set standby period, and a second bit SCD<2> of the set conde SCD may be activated when the difference between the write latency period and the set-on period corresponds to a second set standby period. In addition, a third bit SCD<3> of the set conde SCD may be activated when the difference between the write latency period and the set-on period corresponds to a third set standby period. A configuration and an operation of the set code generation circuit 233 will be described in more detail with reference to FIG. 7 later.

FIG. 6 is a table illustrating the set-on period ODT_ON_PERIOD and the set-off period ODT_OFF_PERIOD which vary according to the signals generated by the operation information storage circuit 231 illustrated in FIG. 5.

Referring to FIG. 6, the set-on period ODT_ON_PERIOD may be set as a period corresponding to two cycles of the dock signal CLK when the first bit ISCD<1> of the internal set code ISCD is activated and the write latency period WL_PERIOD is eight cycles of the dock signal CLK. In such a case, the entry standby period may be set as a period corresponding to six cycles of the dock signal CLK according to a difference between the write latency period WL_PERIOD and the set-on period ODT_ON_PERIOD. The set-on period ODT_ON_PERIOD may be set as a period corresponding to six cycles of the clock signal CLK when the second bit ISCD<2> of the internal set code ISCD is activated and the write latency period WL_PERIOD is twelve cycles of the clock signal CLK. In such a case, the entry standby period may be set as a period corresponding to six cycles of the clock signal CLK according to a difference between the write latency period WL_PERIOD and the set-on period ODT_ON_PERIOD. That is, the entry standby periods may be set to have the same period according to a logic level combination of the write latency signal (WL of FIG. 5) and the internal set code (ISCD of FIG. 5).

In the event that the burst length is set to be "16" (BL16), the set-off period ODT_OFF_PERIOD may be set as a period corresponding to eighteen cycles of the clock signal CLK when the first bit ISCD<1> of the internal set code ISCD is activated and the write latency period WL_PERIOD is eight cycles of the clock signal CLK. In the event that the burst length is set to be "32" (BL32), the set-off period ODT_OFF_PERIOD may be set as a period corresponding to twenty-six cycles of the clock signal CLK when the first bit ISCD<1> of the internal set code ISCD is activated and the write latency period WL_PERIOD is eight cycles of the clock signal CLK. In the event that the burst length is set to be "16" (BL16), the set-off period ODT_OFF_PERIOD may be set as a period corresponding to twenty-two cycles of the clock signal CLK when the second bit ISCD 2> of the internal set code ISCD is activated and the write latency period WL_PERIOD is twelve cycles of the clock signal CLK. In the event that the burst length is set to be "32" (BL32), the set-off period ODT_OFF_PERIOD may be set as a period corresponding to thirty cycles of the clock signal CLK when the second bit ISCD<2> of the internal set code ISCD is activated and the write latency period WL_PERIOD is twelve cycles of the clock signal CLK. That is, the set-off period ODT_OFF_PERIOD may be set a period corresponding to a sum of the write latency period WL_PERIOD and the burst length period (including "L/2" times a cycle of the dock signal CLK when the burst length is set as "L"). Detailed descriptions of the remaining set-on periods ODT_ON_PERIOD and the remaining set-off periods ODT_OFF_PERIOD will be omitted hereinafter.

Figure 7:
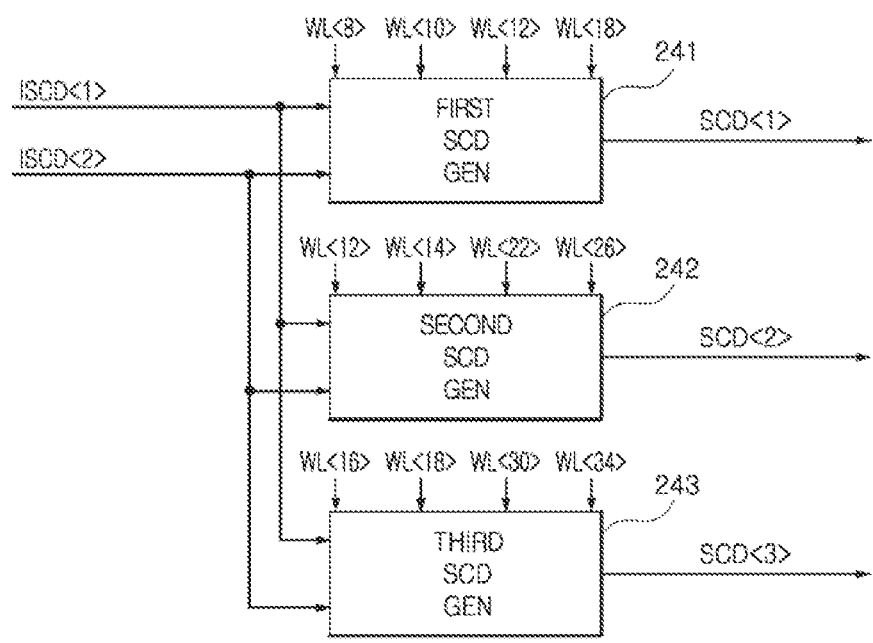
FIG. 7 is a block diagram illustrating a configuration of a set code generation circuit included in the mode register illustrated in FIG. 5.

FIG. 7 is a block diagram illustrating a configuration of the set code generation circuit 233. As illustrated in FIG. 7, the set code generation circuit 233 may include a first set code generation circuit (FIRST_SCD_GEN) 241, a second set code generation circuit (SECOND_SCD_GEN) 242, and a third set code generation circuit (THIRD_SCD_GEN) 243.

The first set code generation circuit 241 may generate a first bit SCD<1> of the set code SCD based on the first and second bits ISCD<1:2> of the internal set code ISCD and the fourth, fifth, sixth, and ninth write latency signals WL<8>, WL<10>, WL<12>, and WL<18> when a difference between the write latency period WL_PERIOD and the set-on period ODT_ON_PERIOD is a first entry standby period. One of the first and second bits ISCD<1:2> included in the internal set code ISCD may be selectively activated when the write operation is performed. The first entry standby period may be set as a period corresponding to six cycles of the dock signal CLK. The first set code generation circuit 241 may enable the first bit SCD<1> of the set code SCD when the first bit ISCD<1> included in the internal set code ISCD is activated and one of the fourth and fifth write latency signals WL<8> and WL<10> is activated. The first set code generation circuit 241 may enable the first bit SCD<1> of the set code SCD when the second bit ISCD<2> included in the internal set code ISCD is activated and one of the sixth and ninth write latency signals WL<12> and WL<8> is activated.

The second set code generation circuit 242 may generate a second bit SCD<2> of the set code SCD based on the first and second bits ISCD<1:2> of the internal set code ISCD and the sixth, seventh, eleventh, and thirteenth write latency signals WL<12>, WL<14>, WL<22>, and WL<26> when a difference between the write latency period WL_PERIOD and the set-on period ODT_ON_PERIOD is a second entry standby period. The second entry standby period may be set as a period corresponding to eight cycles of the clock signal CLK. The second set code generation circuit 242 may enable the second bit SCD<2> of the set code SCD when the first bit ISCD<1> included in the internal set code ISCD is activated and one of the sixth and seventh write latency signals WL<12> and WL<14> is activated. The second set code generation circuit 242 may enable the second bit SCD<2> of the set code SCD when the second bit ISCD<2> included in the internal set code ISCD is activated and one of the eleventh and thirteenth write latency signals WL<22> and WL<26> is activated.

The third set code generation circuit 243 may generate a third bit SCD<3> of the set code SCD based on the first and second bits ISCD<1:2> of the internal set code ISCD and the eighth, ninth, fifteenth, and seventeenth write latency signals WL<16>, WL<18>, WL<30>, and WL<34> when a difference between the write latency period WL PERIOD and the set-on period ODT_ON_PERIOD is a third entry standby period. The third entry standby period may be set as a period corresponding to ten cycles of the dock signal CLK. The third set code generation circuit 243 may enable the third bit SCD<3> of the set code SCD when the first bit ISCD<1> included in the internal set code ISCD is activated and one of the eighth and ninth write latency signals WL 16> and WL<18> is activated. The third set code generation circuit 243 may enable the third bit SCD<3> of the set code SCD when the second bit ISCD<2> included in the internal set code ISCD is activated and one of the fifteenth and seventeenth write latency signals WL<30> and WL<34> is activated.

Figure 8:
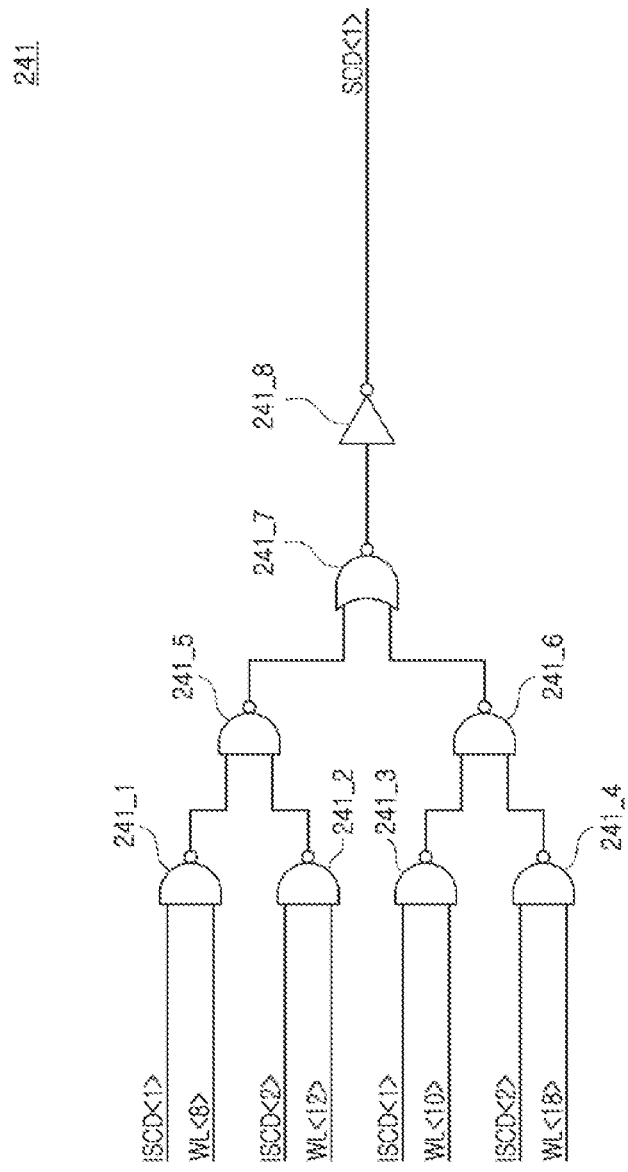
FIG. 8 is a circuit diagram illustrating a configuration of a first set code generation circuit included in the set code generation circuit illustrated in FIG. 7.

FIG. 8 is a circuit diagram illustrating a configuration of the first set code generation circuit 241. As illustrated in FIG. 8, the first set code generation circuit 241 may include NAND gates 241_1, 241_2, 241_3, 241_4, 241_5, and 241_6, a NOR gate 241_7, and an inverter 241_8. The NAND gate 241_1 may perform a logical NAND operation of the first bit ISCD<1> of the internal set code ISCD and the fourth write latency signal WL<8>. The NAND gate 241_2 may perform a logical NAND operation of the second bit ISCD<2> of the internal set code ISCD and the sixth write latency signal WL<12>. The NAND gate 241_3 may perform a logical NAND operation of the first bit ISCD<1> of the internal set code ISCD and the fifth write latency signal WL<1>. The NAND gate 241_4 may perform a logical NAND operation of the second bit ISCD<2> of the internal set code ISCD and the ninth write latency signal WL<18>. The NAND gate 241_5 may perform a logical NAND operation of an output signal of the NAND gate 241_1 and an output signal of the NAND gate 241_2. The NAND gate 241_6 may perform a logical NAND operation of an output signal of the NAND gate 241_3 and an output signal of the NAND gate 241_4. The NOR gate 241_7 may perform a logical NOR operation of an output signal of the NAND gate 241_5 and an output signal of the NAND gate 241_6, The inverter 241_8 may inversely buffer an output signal of the NOR gate 241_7 to generate the first bit SCD<1> of the set code SCD.

Figure 9:
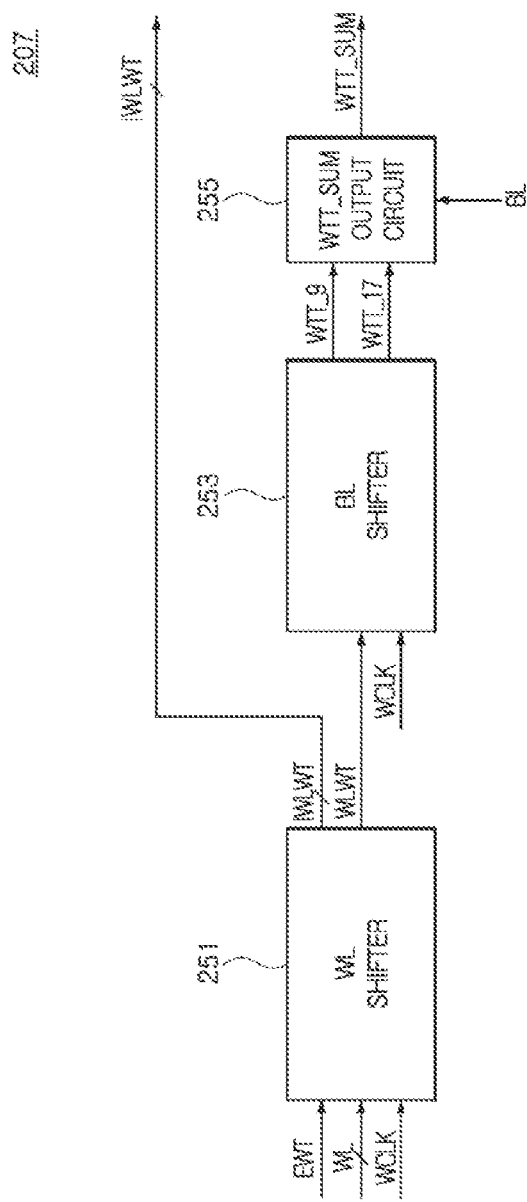
FIG. 9 is a block diagram illustrating a configuration of a write shift circuit included in the electronic device illustrated in FIG. 2.

FIG. 9 is a block diagram illustrating a configuration of the write shift circuit 207, As illustrated in FIG. 9, the write shift circuit 207 may include a write latency shift circuit (WL_SHIFTER) 251, a burst length shift circuit (BL_SHIFTER) 253, and a synthesis write flag output circuit (WTT_SUM_OUTPUT_CIRCUIT) 255.

The write latency shift circuit 251 may shift the write signal EWT during the write latency period based on the write latency signal WL in synchronization with the write clock signal WCLK to sequentially generate the internal latency write signal IWLWT including a plurality of bits and the latency write signal WLWT. The write latency shift circuit 251 may delay the write signal EWT by a period, which is less than the write latency period by the entry standby period, to sequentially generate the plurality of internal latency write signals IWLWT. For example, the write latency shift circuit 251 may delay the write signal EWT by a period, which is less than the write latency period by the first entry standby period, to generate the third internal latency write signal (IWLWT_6 of FIG. 10). The write latency shift circuit 251 may delay the write signal EWT by a period, which is less than the write latency period by the second entry standby period, to generate the fourth internal latency write signal (IWLWT_8 of FIG. 10), The write latency shift circuit 251 may delay the write signal EWT by a period, which is less than the write latency period by the third entry standby period, to generate the fifth internal latency write signal (IWLWT_10 of FIG. 10). The write latency shift circuit 251 may delay the write signal EWT by the write latency period to generate the latency write signal WLWT. A configuration and an operation of the write latency shift circuit 251 will be described in more detail with reference to FIG. 10 later.

The burst length shift circuit 253 may delay the latency write signal WLWT by the burst length period in synchronization with the write clock signal WCLK to sequentially generate a first write flag signal WTT_9 and a second write flag signal WTT_17. The burst length period may include a first burst length period and a second burst length period. For example, the first burst length period may be set as a period corresponding to "16/2" cycles of the clock signal CLK when the burst length is set to be "16", and the second burst length period may be set as a period corresponding to "32/2" cycles of the clock signal CLK when the burst length is set to be "32". The burst length shift circuit 253 may delay the latency write signal WLWT by the first burst length period to generate the first write flag signal WTT_9. The burst length shift circuit 253 may delay the latency write signal WLWT by the second burst length period to generate the second write flag signal WTT_17. A configuration and an operation of the burst length shift circuit 253 will be described in more detail with reference to FIG. 11 later.

The synthesis write flag output circuit 255 may output one of the first write flag signal WTT_9 and the second write flag signal WTT_17 as the synthesis write flag signal WTT_SUM based on the burst length signal BL. The synthesis write flag output circuit 255 may output the first write flag signal WTT_9 as the synthesis write flag signal WTT_SUM when the burst length signal BL is inactivated. The synthesis write flag output circuit 255 may output the second write flag signal WTT_17 as the synthesis write flag signal WTT_SUM when the burst length signal BL is activated.

Figure 10:
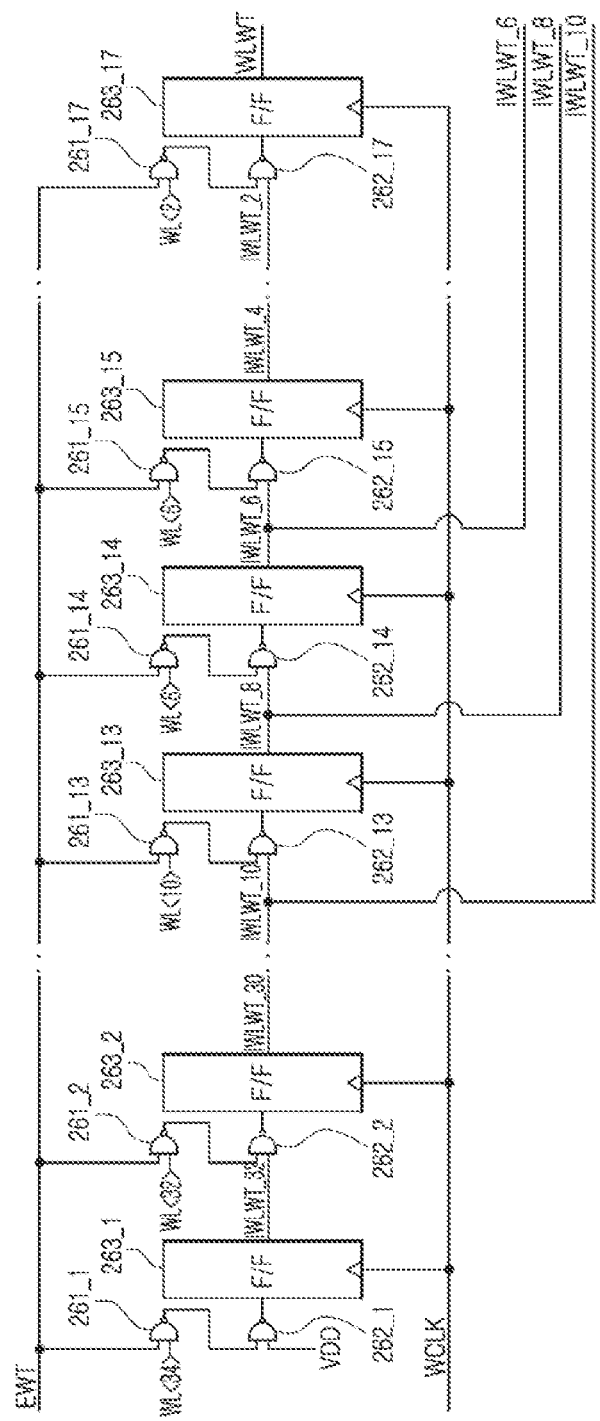
FIG. 10 is a circuit diagram illustrating a configuration of a write latency shift circuit included in the write shift circuit illustrated in FIG. 9.

FIG. 10 is a circuit diagram illustrating a configuration of the write latency shift circuit 251. As illustrated in FIG. 10, the write latency shift circuit 251 may include NAND gates 261_1~261_17 and 262_1~262_17 and flip-flops 263_1~263_17.

The NAND gate 261_1 may perform a logical NAND operation of the write signal EWT and the seventeenth write latency signal WL<34>. The NAND gate 262_1 may perform a logical NAND operation of an output signal of the NAND gate 261_1 and an external voltage VDD. The external voltage VDD may be provided through a power pad (not shown). The flip-flop 263_1 may delay an output signal of the NAND gate 262_1 by two cycles of the clock signal CLK in synchronization with a rising edge of the write clock signal WCLK, thereby generating a sixteenth internal latency write signal IWLWT_32.

The NAND gate 261_2 may perform a logical NAND operation of the write signal EWT and the sixteenth write latency signal WL<32>. The NAND gate 262_2 may perform a logical NAND operation of an output signal of the NAND gate 261_2 and the sixteenth internal latency write signal IWLWT_32. The flip-flop 263_2 may delay an output signal of the NAND gate 262_2 by two cycles of the clock signal CLK in synchronization with a rising edge of the write clock signal WCLK, thereby generating a fifteenth internal latency write signal IWLWT_30.

The NAND gate 261_13 may perform a logical NAND operation of the write signal EWT and the fifth write latency signal WL<10>. The NAND gate 262_13 may perform a logical NAND operation of an output signal of the NAND gate 261_13 and the fifth internal latency write signal IWLWT_10. The flip-flop 263_13 may delay an output signal of the NAND gate 262_13 by two cycles of the clock signal CLK in synchronization with a rising edge of the write clock signal WCLK, thereby generating a fourth internal latency write signal IWLWT_8. The fifth internal latency write signal IWLWT_10 may be generated by delaying the write signal EWT by a period, which is less than the write latency period by the third entry standby period. That is, the fifth internal latency write signal IWLWT_10 may be generated by delaying the write signal EWT by a period, which is less than the write latency period by ten cycles of the clock signal CLK.

The NAND gate 261_14 may perform a logical NAND operation of the write signal EWT and the fourth write latency signal WL<8>. The NAND gate 262_14 may perform a logical NAND operation of an output signal of the NAND gate 261_14 and the fourth internal latency write signal IWLWT_8. The flip-flop 263_14 may delay an output signal of the NAND gate 262_14 by two cycles of the clock signal CLK in synchronization with a rising edge of the write clock signal WCLK, thereby generating a third internal latency write signal IWLWT_6. The fourth internal latency write signal IWLWT_8 may be generated by delaying the write signal EWT by a period, which is less than the write latency period by the second entry standby period. That is, the fourth internal latency write signal IWLWT_8 may be generated by delaying the write signal EWT by a period, which is less than the write latency period by eight cycles of the clock signal CLK.

The NAND gate 261_15 may perform a logical NAND operation of the write signal EWT and the third write latency signal WL<6>. The NAND gate 262_15 may perform a logical NAND operation of an output signal of the NAND gate 261_15 and the third internal latency write signal IWLWT_6. The flip-flop 263_15 may delay an output signal of the NAND gate 262_15 by two cycles of the clock signal CLK in synchronization with a rising edge of the write clock signal WCLK, thereby generating a second internal latency write signal IWLWT_4. The third internal latency write signal IWLWT_6 may be generated by delaying the write signal EWT by a period, which is less than the write latency period by the first entry standby period. That is, the third internal latency write signal IWLWT_6 may be generated by delaying the write signal EWT by a period, which is less than the write latency period by six cycles of the clock signal CLK.

The NAND gate 261_17 may perform a logical NAND operation of the write signal EWT and the first write latency signal WL<2>. The NAND gate 262_17 may perform a logical NAND operation of an output signal of the NAND gate 261_17 and the first internal latency write signal IWLWT_2. The flip-flop 263_17 may delay an output signal of the NAND gate 262_17 by two cycles of the clock signal CLK in synchronization with a rising edge of the write clock signal WCLK, thereby generating the latency write signal WLWT.

Figure 11:
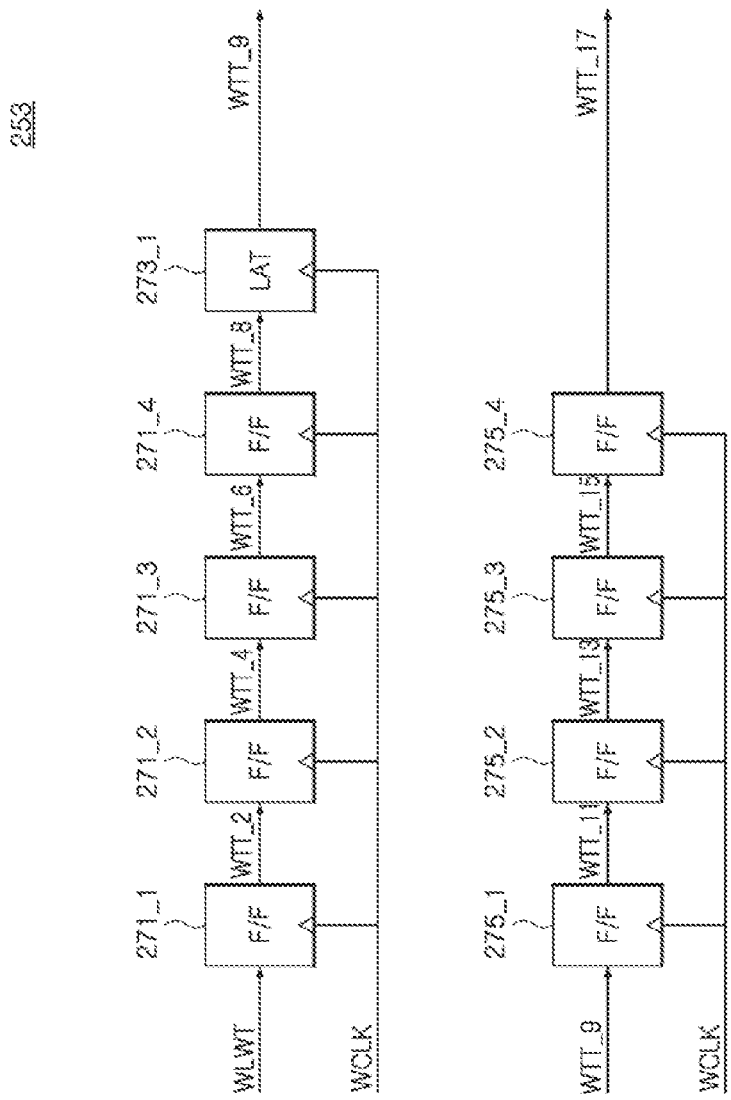
FIG. 11 is a circuit diagram illustrating a configuration of a burst length shift circuit included in the write shift circuit illustrated in FIG. 9.

FIG. 11 is a circuit diagram illustrating a configuration of the burst length shift circuit 253. As illustrated in FIG. 11, the burst length shift circuit 253 may include flip-flops 271_1, 271_2, 271_3, 271_4, 275_1, 275_2, 275_3, and 275_4 and a latch circuit 273_1.

The flip-flop 271_1 may delay the latency write signal WLWT by two cycles of the dock signal CLK in synchronization with the write dock signal WCLK, thereby generating a first delayed latency write signal WTT_2. The flip-flop 271_2 may delay the first delayed latency write signal WTT_2 by two cycles of the clock signal CLK in synchronization with the write clock signal WCLK, thereby generating a second delayed latency write signal WTT_4. The flip-flop 271_3 may delay the second delayed latency write signal WTT_4 by two cycles of the clock signal CLK in synchronization with the write clock signal WCLK, thereby generating a third delayed latency write signal WTT_6. The flip-flop 271_4 may delay the third delayed latency write signal WTT_6 by two cycles of the clock signal CLK in synchronization with the write clock signal WCLK, thereby generating a fourth delayed latency write signal WTT_8. The latch circuit 273_1 may delay the fourth delayed latency write signal WTT_8 by one cycle of the clock signal CLK in synchronization with the write clock signal WCLK, thereby generating the first write flag signal WTT_9. In the present embodiment, the first write flag signal WTT_9 may be generated by delaying the latency write signal WLWT by nine cycles of the clock signal CLK.

The flip-flop 275_1 may delay the first write flag signal WTT_9 by two cycles of the dock signal CLK in synchronization with the write dock signal WCLK, thereby generating a fifth delayed latency write signal WTT_11. The flip-flop 275_2 may delay the fifth delayed latency write signal WTT_11 by two cycles of the clock signal CLK in synchronization with the write clock signal WCLK, thereby generating a sixth delayed latency write signal WTT_13. The flip-flop 275_3 may delay the sixth delayed latency write signal WTT_13 by two cycles of the clock signal CLK in synchronization with the write clock signal WCLK, thereby generating a seventh delayed latency write signal WTT_15. The flip-flop 275_4 may delay the seventh delayed latency write signal WTT_15 by two cycles of the clock signal CLK in synchronization with the write clock signal WCLK, thereby generating the second write flag signal WTT_17. In the present embodiment, the second write flag signal WTT_17 may be generated by delaying the latency write signal WLWT by seventeen cycles of the clock signal CLK.

Figure 12:
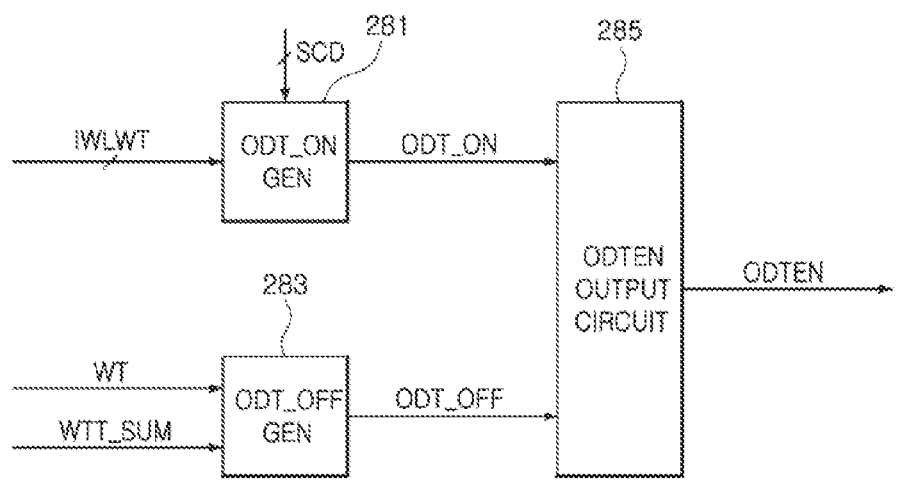
FIG. 12 is a block diagram illustrating a configuration of a termination control circuit included in the electronic device illustrated in FIG. 2.

FIG. 12 is a block diagram illustrating a configuration of the termination control circuit 209. As illustrated in FIG. 12, the termination control circuit 209 may include a termination-on signal generation circuit (ODT_ON_GEN) 281, a termination-off signal generation circuit (ODT_OFF_GEN) 283, and a termination enablement signal generation circuit (ODTEN_OUTPUT_CIRCUIT) 285.

The termination-on signal generation circuit 281 may generate the termination-on signal ODT_ON based on the set code SCD and the internal latency write signal IWLWT including a plurality of bits whenever the write operation is performed. For example, the termination-on signal generation circuit 281 may generate the termination-on signal ODT_ON which is activated at an end point in time of the set-on period of the first write operation when the first write operation is performed. The termination-on signal generation circuit 281 may generate the termination-on signal ODT_ON which is activated at an end point in time of the set-on period of the second write operation when the second write operation is performed. The termination-on signal generation circuit 281 may output one of the plurality of bit included in the internal latency write signal IWLWT as the termination-on signal ODT_ON according to a logic level combination of the set code SCE), For example, the termination-on signal generation circuit 281 may output the third internal latency write signal IWLWT_6 as the termination-on signal ODT_ON when the first bit SCD<1> of the set code SCD is activated. The termination-on signal generation circuit 281 may output the fourth internal latency write signal IWLWT_8 as the termination-on signal ODT_ON when the second bit SCD<2> of the set code SCD is activated. The termination-on signal generation circuit 281 may output the fifth internal latency write signal IWLWT_10 as the termination-on signal ODT_ON when the third bit SCD<3> of the set code SCD is activated. A configuration and an operation of the termination-on signal generation circuit 281 will be described in more detail with reference to FIG. 13 later.

The termination-off signal generation circuit 283 may generate a termination-off signal ODT_OFF based on the write command WT and the synthesis write flag signal WTT_SUM. The termination-off signal generation circuit 283 may compare the number of times the write command WT is input with the number of times the synthesis write flag signal WTT_SUM is input and may generate the termination-off signal ODT_OFF according to the comparison result. The termination-off signal generation circuit 283 may generate the termination-off signal ODT_OFF which is activated when the number of times the write command WT is input is equal to the number of times the synthesis write flag signal WTT_SUM is input. For example, the termination-off signal generation circuit 283 may generate the termination-off signal ODT_OFF which is activated when the write command WT is inputted once and the synthesis write flag signal WTT_SUM is inputted once during the write operation. The termination-off signal generation circuit 283 may generate the termination-off signal ODT_OFF which is inactivated when the number of times the write command WT is input is greater than the number of times the synthesis write flag signal WTT_SUM is input. For example, the termination-off signal generation circuit 283 may generate the termination-off signal ODT_OFF which is inactivated when the write command WT is inputted twice and the synthesis write flag signal WTT_SUM is inputted once during the write operation. The termination-off signal generation circuit 283 may generate a detection signal (DET of FIG. 14) and the internal termination-off signal (IODT_OFF of FIG. 14) when the write operation is performed. The termination-off signal generation circuit 283 may generate the termination-off signal ODT_OFF from the internal termination-off signal (IODT_OFF of FIG. 14) based on the detection signal (DET of FIG. 14). The termination-off signal generation circuit 283 may generate the detection signal (DET of FIG. 14) which is activated when the write command WT is not inputted to the termination-off signal generation circuit 283 during the set detection period of the write operation. The termination-off signal generation circuit 283 may maintain the internal termination-off signal (IODT_OFF of FIG. 14) having an inactivated state until a point in time when the internal termination-off signal (IODT_OFF of FIG. 14) is activated during the second write operation, when the write command WT for the second write operation is inputted during the set detection period of the first write operation. Thus, the termination-off signal generation circuit 283 may adjust a point in time when the termination-off signal ODT_OFF is activated according to whether the write command WT is inputted to the termination-off signal generation circuit 283 during the set detection period of the write operation. As a result, it may be possible to reduce the power consumption of a circuit for adjusting the termination operation period when the write operation is successively performed. A configuration and an operation of the termination-off signal generation circuit 283 will be described in more detail with reference to FIG. 14 later.

The termination enablement signal generation circuit 285 may generate the termination enablement signal ODTEN which is activated during an activation period of the termination resistor based on the termination-on signal ODT_ON and the termination-off signal ODT_OFF. The termination enablement signal generation circuit 285 may activate the termination enablement signal ODTEN when the termination-on signal ODT_ON is activated and may inactivate the termination enablement signal ODTEN when the termination-off signal ODT_OFF is activated. The termination enablement signal generation circuit 285 may activate the termination enablement signal ODTEN when the termination-on signal ODT_ON is activated during the first write operation. The termination enablement signal generation circuit 285 may maintain the termination enablement signal ODTEN having an activated state until a point in time when the internal termination-off signal (IODT_OFF of FIG. 14) is activated during the second write operation, when the termination-on signal ODT_ON is activated during the set detection period of the first write operation when the second write operation is performed. A configuration and an operation of the termination enablement signal generation circuit 285 will be described in more detail with reference to FIG. 18 later.

Figure 13:
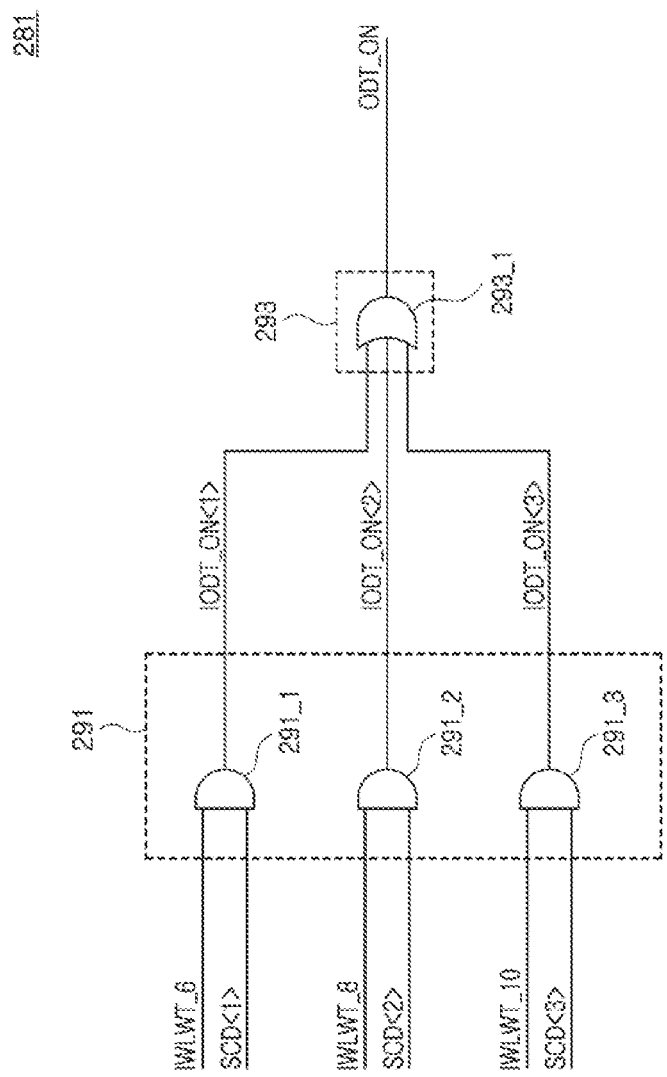
FIG. 13 is a circuit diagram illustrating a configuration of a termination-on signal generation circuit included in the termination control circuit illustrated in FIG. 12.

FIG. 13 is a circuit diagram illustrating a configuration of the termination-on signal generation circuit 281. As illustrated in FIG. 13, the termination-on signal generation circuit 281 may include an internal termination-on signal generation circuit 291 and an internal termination-on signal synthesis circuit 293.

The internal termination-on signal generation circuit 291 may generate an internal termination-on signal IODT_ON including a plurality of bits from the internal latency write signal IWLWT including a plurality of bits according to a logic level combination of the set code SCD. The internal termination-on signal generation circuit 291 may output the third internal latency write signal IWLWT_6 as a first internal termination-on signal IODT_ON<1> when the first bit SCD<1> of the set code SCD is activated. The internal termination-on signal generation circuit 291 may output the fourth internal latency write signal IWLWT_8 as a second internal termination-on signal IODT_ON<2> when the second bit SCD<2> of the set code SCD is activated. The internal termination-on signal generation circuit 291 may output the fifth internal latency write signal IWLWT_10 as a third internal termination-on signal IODT_ON<3> when the third bit SCD<3> of the set code SCD is activated. The internal termination-on signal generation circuit 291 may include AND gates 291_1, 291_2, and 291_3. The AND gate 291_1 may buffer the third internal latency write signal IWLWT_6 to output the buffered signal of the third internal latency write signal IWLWT_6 as the first internal termination-on signal IODT_ON<1> when the first bit SCD<1> of the set code SCD is activated. The AND gate 291_2 may buffer the fourth internal latency write signal IWLWT_8 to output the buffered signal of the fourth internal latency write signal IWLWT_8 as the second internal termination-on signal IODT_ON<2> when the second bit SCD<2> of the set code SCD is activated. The AND gate 291_3 may buffer the fifth internal latency write signal IWLWT_10 to output the buffered signal of the fifth internal latency write signal IWLWT_10 as the third internal termination-on signal IODT_ON<3> when the third bit SCD<3> of the set code SCD is activated.

The internal termination-on signal synthesis circuit 293 may synthesize the first, second, and third internal termination-on signals IODT_ON<1:3> to generate the termination-on signal ODT_ON. The internal termination-on signal synthesis circuit 293 may active the termination-on signal ODT_ON when one of the first, second, and third internal termination-on signals IODT_ON<1:3> is activated. The internal termination-on signal synthesis circuit 293 may include an OR gate 293_1. The OR gate 293_1 may generate the termination-on signal ODT_ON which is activated to have a logic "high" level when one of the first, second, and third internal termination-on signals IODT_ON<1:3> is activated to have a logic "high" level.

Figure 14:
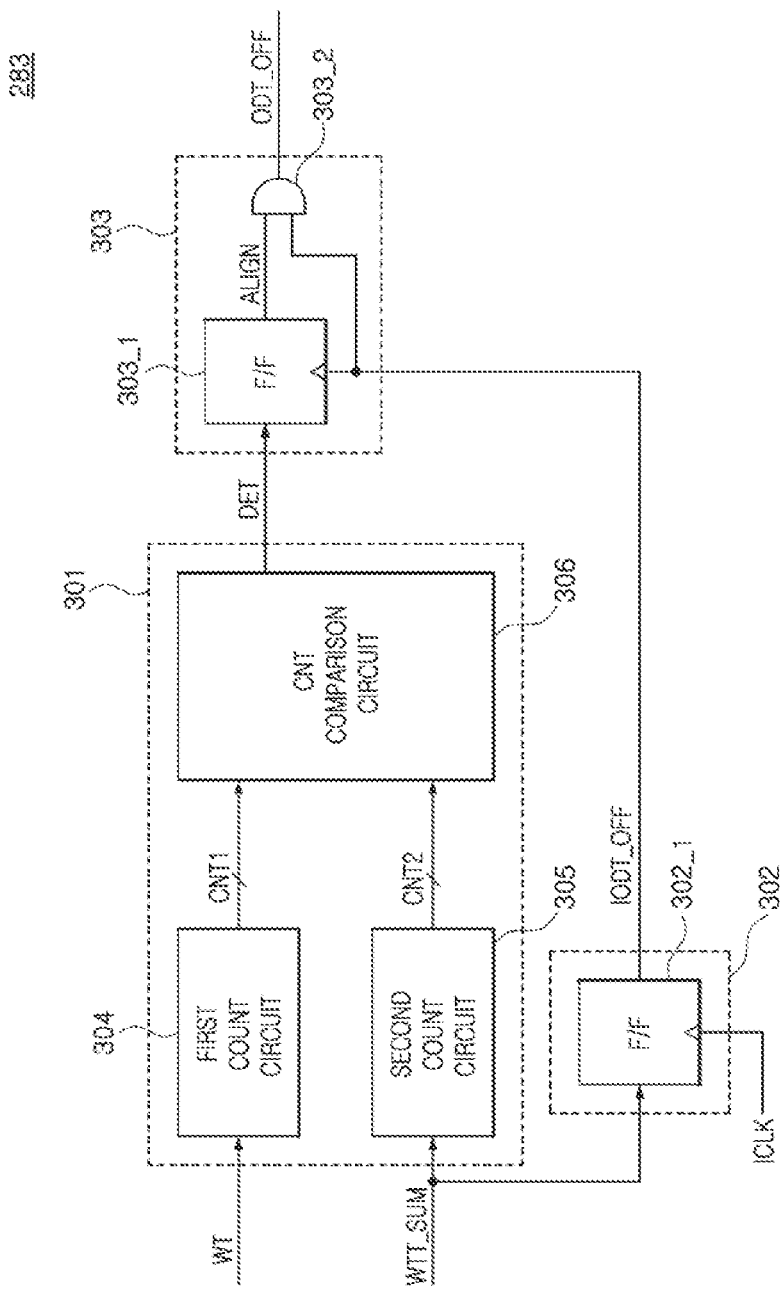
FIG. 14 illustrates a configuration of a termination-off signal generation circuit included in the termination control circuit illustrated in FIG. 12.

FIG. 14 illustrates a configuration of the termination-off signal generation circuit 283. As illustrated in FIG. 14, the termination-off signal generation circuit 283 may include a detection circuit 301, an internal delay circuit 302, and a termination-off signal output circuit 303.

The detection circuit 301 may include a first count circuit 304, a second count circuit 305, and a count comparison circuit 306, The detection circuit 301 may generate a detection signal DET based on the write command WT and the synthesis write flag signal WTT_SUM. The detection circuit 301 may compare the number of times the write command WT is input with the number of times the synthesis write flag signal WTT_SUM is input to generate the detection signal DET according to the comparison result. The detection circuit 301 may activate the detection signal DET when the number of times the write command WT is input is equal to the number of times the synthesis write flag signal WTT_SUM is input. For example, the detection circuit 301 may activate the detection signal DET when the write command WT is inputted once and the synthesis write flag signal WTT_SUM is inputted once during the write operation. The detection circuit 301 may inactivate the detection signal DET when the number of times the write command WT is input is greater than the number of times the synthesis write flag signal WTT_SUM is input. For example, the detection circuit 301 may inactivate the detection signal DET when the write command WT is inputted twice and the synthesis write flag signal WTT_SUM is inputted once during the write operation. Thus, the detection circuit 301 may generate the detection signal DET according to whether the write command WT is inputted to the detection circuit 301 during the set detection period of the write operation, thereby reducing the power consumption of a circuit for adjusting the termination operation period when the write operation is successively performed.

The first count circuit 304 may sequentially activate a plurality of bits included in a first count signal CNT1 whenever the write command WT is inputted to the first count circuit 304. For example, the first count circuit 304 may generate a first bit CNT1<1> of the first count signal CNT1 which is activated to have a logic "high" level when the write command WT for the first write operation is inputted to the first count circuit 304, and the first count circuit 304 may generate a second bit CNT1<2> of the first count signal CNT1 which is activated to have a logic "high" level when the write command WT for the second write operation is inputted to the first count circuit 304. A configuration and an operation of the first count circuit 304 will be described in more detail with reference to FIG. 15 later.

The second count circuit 305 may sequentially activate a plurality of bits included in a second count signal CNT2 whenever the synthesis write flag signal WTT_SUM is inputted to the second count circuit 305. For example, the second count circuit 305 may generate a first bit CNT2<1> of the second count signal CNT2 which is activated to have a logic "high" level when the synthesis write flag signal WTT_SUM for the first write operation is inputted to the second count circuit 305, and the second count circuit 305 may generate a second bit CNT2<2> of the second count signal CNT2 which is activated to have a logic "high" level when the synthesis write flag signal WTT_SUM for the second write operation is inputted to the second count circuit 305. A configuration and an operation of the second count circuit 305 will be described in more detail with reference to FIG. 16 later.

The count comparison circuit 306 may generate the detection signal DET based on the first count signal CNT1 and the second count signal CNT2, The count comparison circuit 306 may activate the detection signal DET when the first count signal CNT1 and the second count signal CNT2 have the same logic level. The count comparison circuit 306 may inactivate the detection signal DET when the first count signal CNT1 and the second count signal CNT2 have different logic levels. A configuration and an operation of the count comparison circuit 306 will be described in more detail with reference to FIG. 17 later.

The internal delay circuit 302 may delay the synthesis write flag signal WTT_SUM by the end delay period in synchronization with the internal clock signal ICLK to generate the internal termination-off signal IODT_OFF. The end delay period may be set as a period from a point in time when the synthesis write flag signal WTT_SUM is activated until a point in time when the set-off period is terminated, That is, the internal termination-off signal IODT_OFF may be activated at an end point in time of the set-off period whenever the write operation is performed. For example, the internal delay circuit 302 may delay the synthesis write flag signal WTT_SUM by one cycle of the dock signal CLK to generate the internal termination-off signal IODT_OFF which is activated at an end point in time of the set-off period, when the end delay period is set as one cycle of the dock signal CLK, The internal delay circuit 302 may include a flip-flop 302_1. The flip-flop 302_1 may delay the synthesis write flag signal WTT_SUM by one cycle of the internal clock signal ICLK in synchronization with a rising edge of the internal clock signal ICLK, thereby generating the internal termination-off signal IODT_OFF.

The termination-off signal output circuit 303 may output the internal termination-off signal IODT_OFF as the termination-off signal ODT_OFF when the detection signal DET is activated. The termination-off signal output circuit 303 may include a flip-flop 303_1 and an AND gate 303_2, The flip-flop 303_1 may latch the detection signal DET to output the latched signal of the detection signal DET as an alignment signal ALIGN when the internal termination-off signal IODT_OFF is activated to have a logic "high" level. The AND gate 303_2 may buffer the internal termination-off signal IODT_OFF to output the buffered signal of the internal termination-off signal IODT_OFF as the termination-off signal ODT_OFF when the alignment signal ALIGN is activated to have a logic "high" level.

Figure 15:
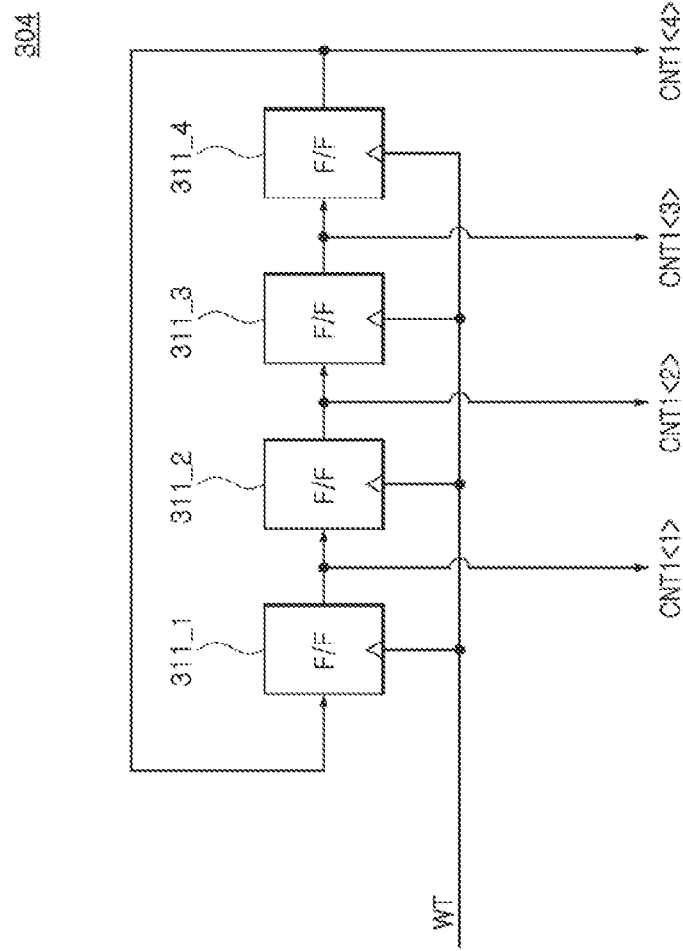
FIG. 15 is a circuit diagram illustrating a configuration of a first count circuit included in the termination-off signal generation circuit illustrated in FIG. 14.

FIG. 15 is a circuit diagram illustrating a configuration of the first count circuit 304. As illustrated in FIG. 15, the first count circuit 304 may include flip-flops 311_1, 311_2, 311_3, and 311_4, The first count circuit 304 may sequentially activate the first to fourth bits CNT1<1:4> of the first count signal CNT1 whenever the write command WT is inputted to the first count circuit 304. Logic levels of the first to fourth bits CNT1<1:4> included in the first count signal CNT1 which is initialized may be set to be different according to the embodiments. For example, in an embodiment, the first, second, and third bits CNT1<1:3> of the first count signal CNT1 may be set to have a logic "low" level by an initialization operation, and the fourth bit CNT1<4> of the first count signal CNT1 may be set to have a logic "high" level by the initialization operation. The flip-flop 311_1 may latch the fourth bit CNT1<4> (activated to have a logic "high" level) of the first count signal CNT1 to generate the first bit CNT1<1> (activated to have a logic "high" level) of the first count signal CNT1 when the write command WT is inputted. The flip-flop 311_2 may latch the first bit CNT1<1> (activated to have a logic "high" level) of the first count signal CNT1 to generate the second bit CNT1<2> (activated to have a logic "high" level) of the first count signal CNT1 when the write command WT is inputted. The flip-flop 311_3 may latch the second bit CNT1<2> (activated to have a logic "high" level) of the first count signal CNT1 to generate the third bit CNT1<3> (activated to have a logic "high" level) of the first count signal CNT1 when the write command WT is inputted. The flip-flop 311_4 may latch the third bit CNT1<3> (activated to have a logic "high" level) of the first count signal CNT1 to generate the fourth bit CNT1<4> (activated to have a logic "high" level) of the first count signal CNT1 when the write command WT is inputted.

Figure 16:
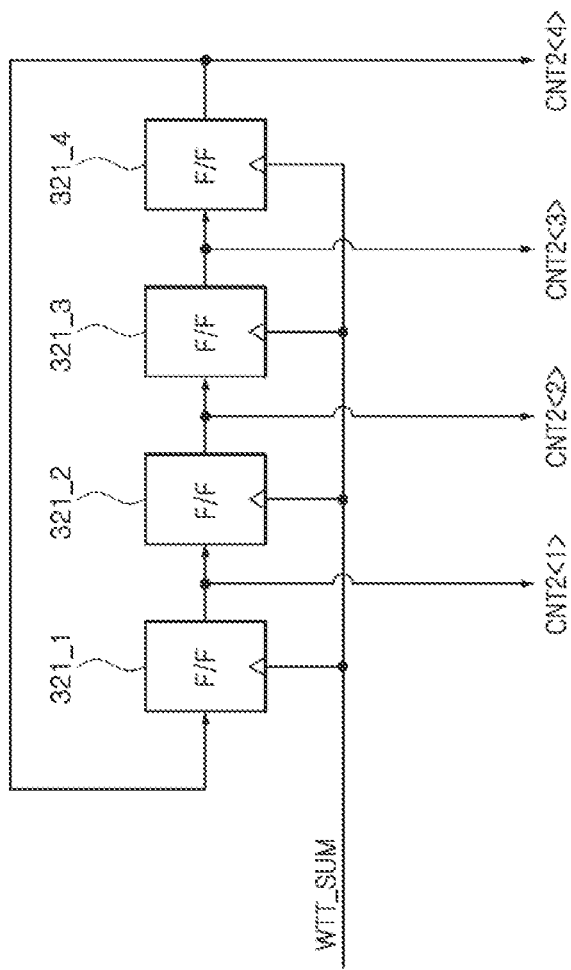
FIG. 16 is a circuit diagram illustrating a configuration of a second count circuit included in the termination-off signal generation circuit illustrated in FIG. 14.

FIG. 16 is a circuit diagram illustrating a configuration of the second count circuit 305. As illustrated in FIG. 16, the second count circuit 305 may include flip-flops 321_1, 321_2, 321_3, and 321_4, The second count circuit 305 may sequentially activate the first to fourth bits CNT2<1:4> of the second count signal CNT2 whenever the synthesis write flag signal WTT_SUM is inputted to the second count circuit 305. Logic levels of the first to fourth bits CNT2<1:4> included in the second count signal CNT2 which is initialized may be set to be different according to the embodiments. For example, in an embodiment, the first, second, and third bits CNT2<1:3> of the second count signal CNT2 may be set to have a logic "low" level by an initialization operation, and the fourth bit CNT2<4> of the second count signal CNT2 may be set to have a logic "high" level by the initialization operation. The flip-flop 321_1 may latch the fourth bit CNT2<4> (activated to have a logic "high" level) of the second count signal CNT2 to generate the first bit CNT2<1> (activated to have a logic "high" level) of the second count signal CNT2 when the synthesis write flag signal WTT_SUM is inputted. The flip-flop 321_2 may latch the first bit CNT2<1> (activated to have a logic "high" level) of the second count signal CNT2 to generate the second bit CNT2<2> (activated to have a logic "high" level) of the second count signal CNT2 when the synthesis write flag signal WTT_SUM is inputted. The flip-flop 321_3 may latch the second bit CNT2<2> (activated to have a logic "high" level) of the second count signal CNT2 to generate the third bit CNT2<3> (activated to have a logic "high" level) of the second count signal CNT2 when the synthesis write flag signal WTT_SUM is inputted. The flip-flop 321_4 may latch the third bit CNT2<3> (activated to have a logic "high" level) of the second count signal CNT2 to generate the fourth bit CNT2<4> (activated to have a logic "high" level) of the second count signal CNT2 when the synthesis write flag signal WTT_SUM is inputted.

Figure 17:
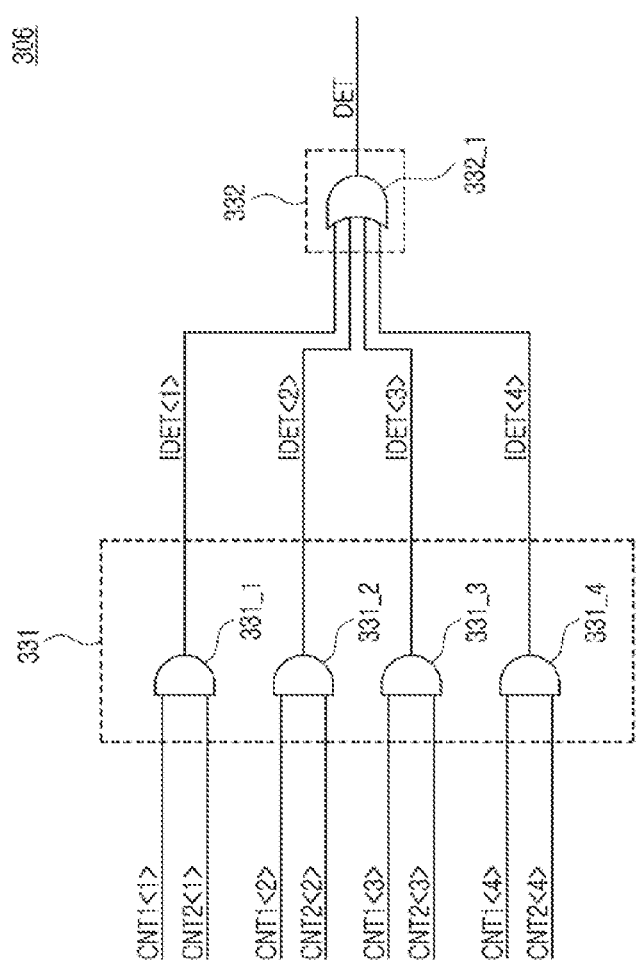
FIG. 17 is a circuit diagram illustrating a configuration of a count comparison circuit included in the termination-off signal generation circuit illustrated in FIG. 14.

FIG. 17 is a circuit diagram illustrating a configuration of the count comparison circuit 306. As illustrated in FIG. 17, the count comparison circuit 306 may include an internal detection signal generation circuit 331 and an internal detection signal synthesis circuit 332.

The internal detection signal generation circuit 331 may generate an internal detection signal IDET based on the first count signal CNT1 and the second count signal CNT2. The internal detection signal generation circuit 331 may generate the internal detection signal IDET which is activated to have a logic "high" level when both of the first count signal CNT1 and the second count signal CNT2 have a logic "high" level. The internal detection signal generation circuit 331 may generate the internal detection signal IDET which is inactivated to have a logic "low" level when one of the first count signal CNT1 and the second count signal CNT2 has a logic "low" level. The internal detection signal generation circuit 331 may include AND gates 331_1, 331_2, 331_3, and 331_4, and the internal detection signal IDET may include first, second, third, and fourth internal detection signals IDET<1>, IDET<2>, IDET<3>, and IDET<4>. The AND gate 331_1 may generate the first internal detection signal IDET<1> which is activated to have a logic "high" level when both of the first bit CNT1<1> of the first count signal CNT1 and the first bit CNT2<1> of the second count signal CNT2 are activated to have a logic "high" level. The AND gate 331_1 may generate the first internal detection signal IDET<1> which is inactivated to have a logic "low" level when one of the first bit CNT1<1> of the first count signal CNT1 and the first bit CNT2<1> of the second count signal CNT2 is inactivated to have a logic "low" level. The AND gate 331_2 may generate the second internal detection signal IDET<2> which is activated to have a logic "high" level when both of the second bit CNT1<2> of the first count signal CNT1 and the second bit CNT2<2> of the second count signal CNT2 are activated to have a logic "high" level. The AND gate 331_2 may generate the second internal detection signal IDET<2> which is inactivated to have a logic "low" level when one of the second bit CNT1<2> of the first count signal CNT1 and the second bit CNT2<2> of the second count signal CNT2 is inactivated to have a logic "low" level. The AND gate 331_3 may generate the third internal detection signal IDET<3> which is activated to have a logic "high" level when both of the third bit CNT1<3> of the first count signal CNT1 and the third bit CNT2<3> of the second count signal CNT2 are activated to have a logic "high" level. The AND gate 331_3 may generate the third internal detection signal IDET<3> which is inactivated to have a logic "low" level when one of the third bit CNT1<3> of the first count signal CNT1 and the third bit CNT2<3> of the second count signal CNT2 is inactivated to have a logic "low" level. The AND gate 331_4 may generate the fourth internal detection signal IDET<4> which is activated to have a logic "high" level when both of the fourth bit CNT1<4> of the first count signal CNT1 and the fourth bit CNT2<4> of the second count signal CNT2 are activated to have a logic "high" level. The AND gate 331_4 may generate the fourth internal detection signal IDET<4> which is inactivated to have a logic "low" level when one of the fourth bit CNT1<4> of the first count signal CNT1 and the fourth bit CNT2<4> of the second count signal CNT2 is inactivated to have a logic "low" level.

The internal detection signal synthesis circuit 332 may synthesize the first to fourth internal detection signals IDET<1:4> to generate the detection signal DET. The internal detection signal synthesis circuit 332 may generate the detection signal DET which is activated to have a logic "high" level when at least one of the first, second, third, and fourth internal detection signals IDET<1:4> is activated to have a logic "high" level. The internal detection signal synthesis circuit 332 may include an OR gate 332_1. The OR gate 332_1 may generate the detection signal DET which is activated to have a logic "high" level when at least one of the first, second, third, and fourth internal detection signals IDET<1:4> is activated to have a logic "high" level.

Figure 18:
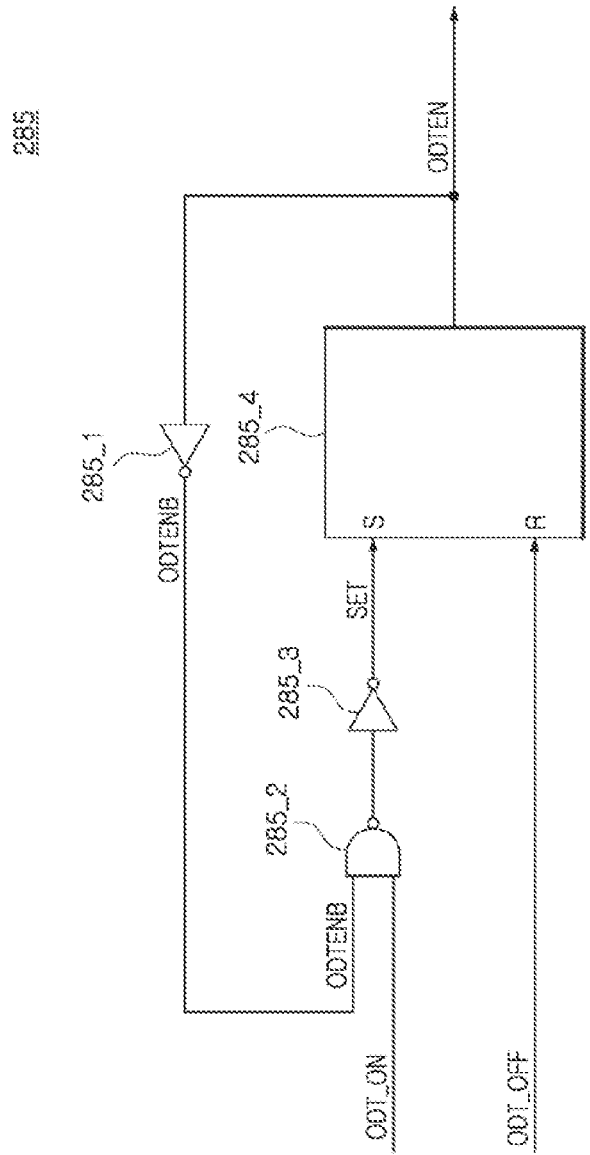
FIG. 18 is a circuit diagram illustrating a configuration of a termination enablement signal generation circuit included in the termination control circuit illustrated in FIG. 12.

FIG. 18 is a circuit diagram illustrating a configuration of the termination enablement signal generation circuit 285. As illustrated in FIG. 18, the termination enablement signal generation circuit 285 may include inverters 285_1 and 285_3, a NAND gate 285_2, and an S-R latch 285_4.

The inverter 285_1 may inversely buffer the termination enablement signal ODTEN to generate an inverted termination enablement signal ODTENB. The inverted termination enablement signal ODTENB may be activated to have a logic "low" level during the termination operation. The NAND gate 285_2 may inversely buffer the termination-on signal ODT_ON when the inverted termination enablement signal ODTENB is activated to have a logic "low" level. The inverter 285_3 may inversely buffer an output signal of the NAND gate 285_2 to generate a set signal SET. The S-R latch 285_4 may generate the termination enablement signal ODTEN which is activated to have a logic "high" level when the set signal SET is activated to have a logic "high" level and may generate the termination enablement signal ODTEN which is inactivated to have a logic "low" level when the termination-off signal ODT_OFF is activated to have a logic "high" level.

Figure 19:
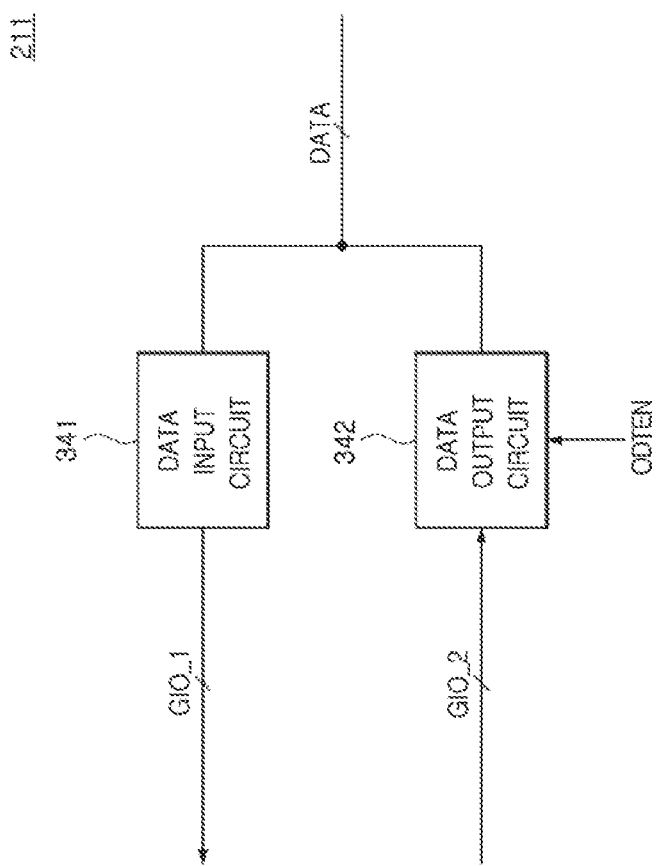
FIG. 19 is a block diagram illustrating a configuration of a data I/O circuit included in the electronic device illustrated in FIG. 2.

FIG. 19 is a block diagram illustrating a configuration of the data I/O circuit 211. As illustrated in FIG. 19, the data I/O circuit 211 may include a data input circuit 341 and a data output circuit 342.

The data input circuit 341 may receive the data DATA from the controller (110 of FIG. 1) to output the data DATA to the input line GIO_1 when the write operation is performed.

The data output circuit 342 may receive the data DATA from the output line GIO_2 to output the data DATA to the controller (110 of FIG. 1) when the read operation is performed. The data output circuit 342 may include the termination resistor. The data output circuit 342 activate the termination resistor while the termination enablement signal ODTEN is activated when the write operation is performed.

FIGS. 20, 21, 22, 23, and 24 illustrate the termination operation performed by the electronic device 120 illustrated in FIG. 2.

Figure 20:
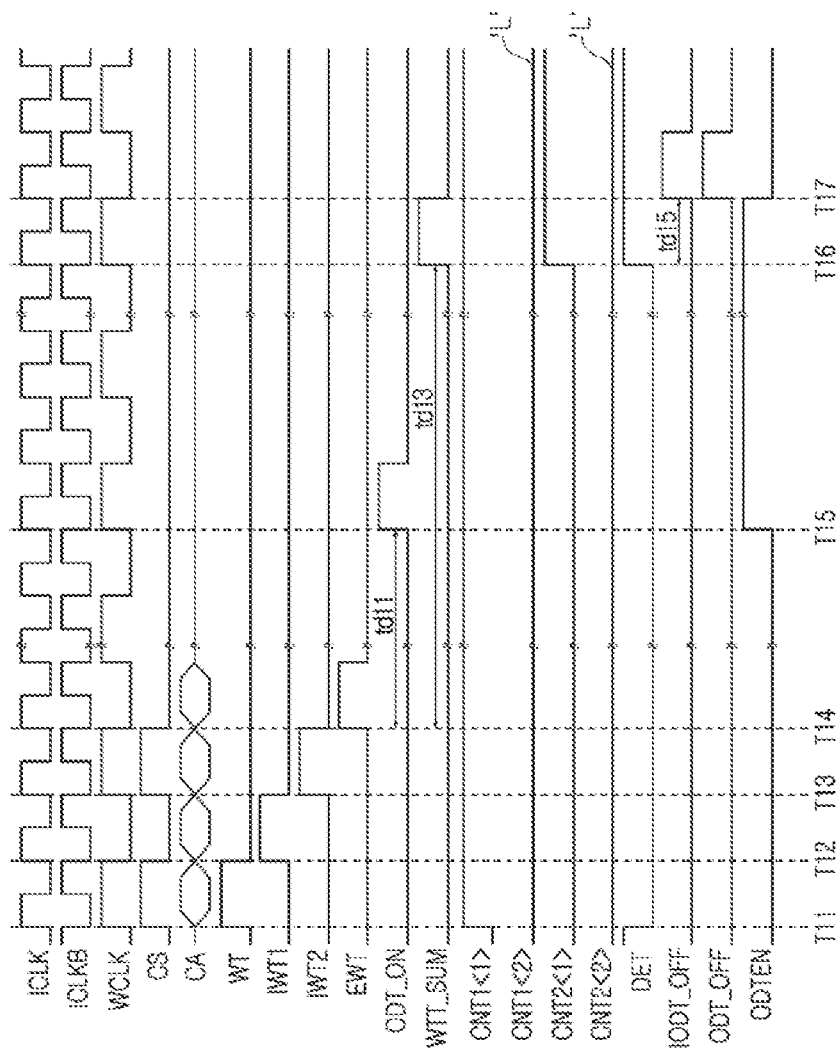
FIGS. 20, 21, 22, 23, and 24 illustrate a termination operation performed by the electronic device illustrated in FIG. 2.
Figure 21:
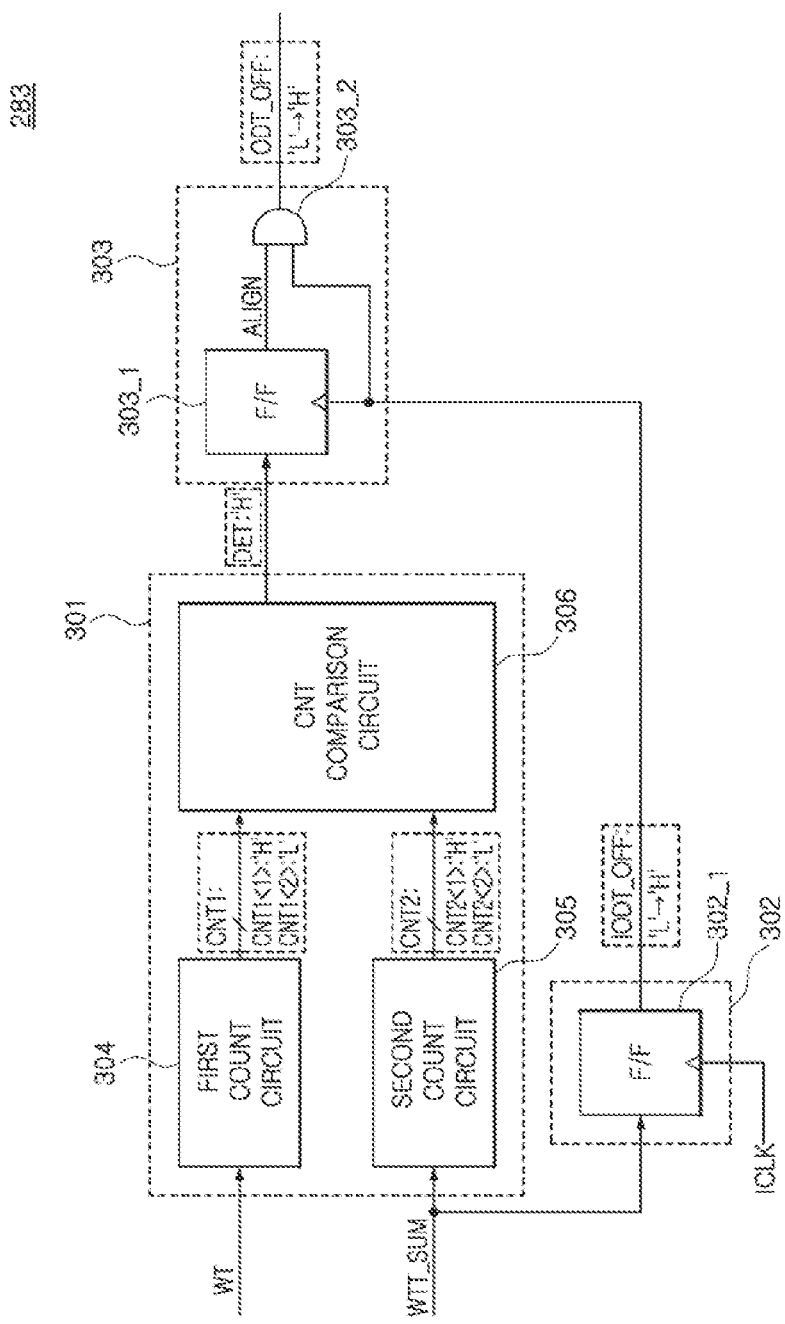

FIG. 20 is a timing diagram illustrating the termination operation when the write command WT is not inputted during the set detection period of the write operation performed by the electronic device 120. FIG. 21 illustrates an operation of the termination-off signal generation circuit 283 at a point in time "T17" of FIG. 20.

Referring to FIG. 20, the write clock generation circuit 201 may generate the internal clock signal ICLK, the inverted internal clock signal ICLKB, and the write clock signal WCLK based on the clock signal CLK.

At a point in time "T11", the command generation circuit 203 may generate the write command WT based on the chip selection signal CS and the command/address signal CA.

At the point in time "T11" the first count circuit (304 of FIG. 15) may generate the first bit (CNT1<1> of FIG. 15) of the first count signal CNT1 which is activated to have a logic "high" level when the write command WT is inputted to the first count circuit 304.

At the point in time "T11", the count comparison circuit (306 of FIG. 14) may generate the detection signal DET which is inactivated to have a logic "low" level when the first count signal (CNT1 of FIG. 14) and the second count signal (CNT2 of FIG. 14) have different logic levels.

At a point in time "T12", the command generation circuit 203 may delay the write command WT by one cycle of the internal clock signal ICLK to generate the first internal write signal (IWT1 of FIG. 4).

At a point in time "T13", the command generation circuit 203 may delay the first internal write signal (IWT1 of FIG. 4) by one cycle of the internal clock signal ICLK to generate the second internal write signal (IWT2 of FIG. 4).

At a point in time "T14", the command generation circuit 203 may delay the second internal write signal (IWT2 of FIG. 4) by one cycle of the internal clock signal ICLK to generate the write signal EWT.

At a point in time "T15", the termination control circuit 209 may output one of the plurality of internal latency write signals IWLWT, which are generated by delaying the write signal EWT by a set-on period "td11", as the termination-on signal (ODT_ON of FIG. 12) based on the set code SCD.

At the point in time "T15", the termination control circuit 209 may generate the termination enablement signal ODTEN which is activated to have a logic "high" level based on the termination-on signal (ODT_ON of FIG. 12).

At a point in time "T16", the write shift circuit 207 may delay the write signal EWT by a period "td13", which corresponds to a sum of the write latency period and the burst length period, to generate the synthesis write flag signal WTT_SUM.

At the point in time "T16", the second count circuit (305 of FIG. 16) may generate the first bit (CNT2<1> of FIG. 16) of the second count signal CNT2 which is activated to have a logic "high" level when the synthesis write flag signal WTT_SUM is inputted to the second count circuit 305.

At the point in time "T16", the count comparison circuit (306 of FIG. 14) may generate the detection signal DET which is activated to have a logic "high" level when the first count signal (CNT1 of FIG. 14) and the second count signal (CNT2 of FIG. 14) have the same logic level.

Referring to FIGS. 20 and 21, at a point in brae "T17", the first bit CNT1<1> of the first count signal CNT1 may have an activated state of a logic "high(H)" level and the second bit CNT1<2> of the first count signal CNT1 may have an inactivated state of a logic "low(L)" level.

At the point in time "T17", the first bit CNT2<1> of the second count signal CNT2 may have an activated state of a logic "high(H)" level and the second bit CNT2<2> of the second count signal CNT2 may have an inactivated state of a logic "low(L)" level.

At the point in time "T17", the detection signal DET may have an activated state of a logic "high(H)" level.

At the point in time "T17", the internal delay circuit 302 may delay the synthesis write flag signal WTT_SUM by a set-off period "td15" to generate the internal termination-off signal IODT_OFF which is activated to have a logic "high (H)" level.

At the point in time "T17", the termination-off signal output circuit 303 may generate the termination-off signal ODT_OFF which is activated to have a logic "high(H)" level based on the internal termination-off signal IODT_OFF when the detection signal DET is activated.

Referring to FIG. 20, at the point in time "T17", the termination control circuit 209 may inactivate the termination enablement signal ODTEN based on the termination-off signal (ODT_OFF of FIG. 12) which is activated.

Figure 22:
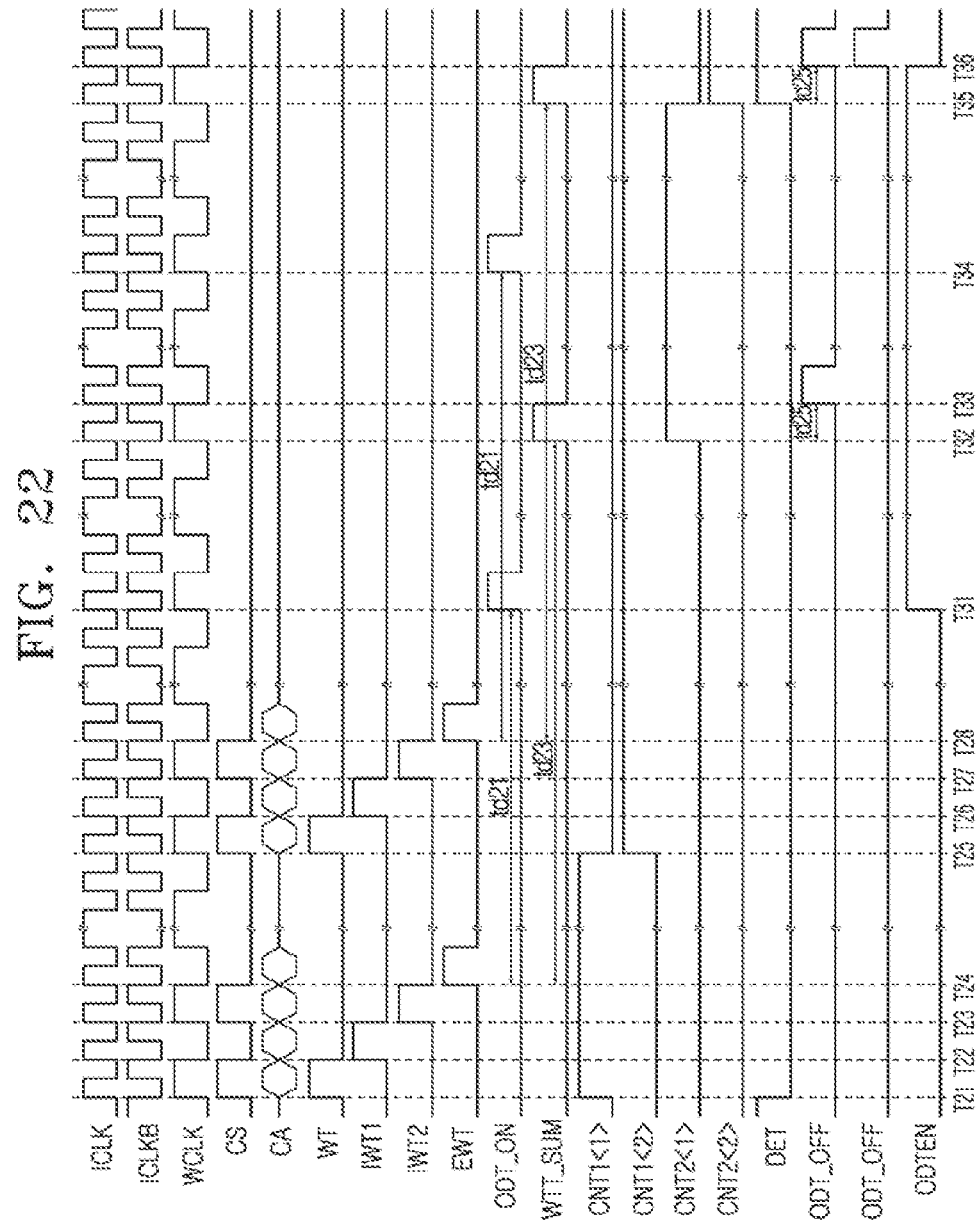
Figure 23:
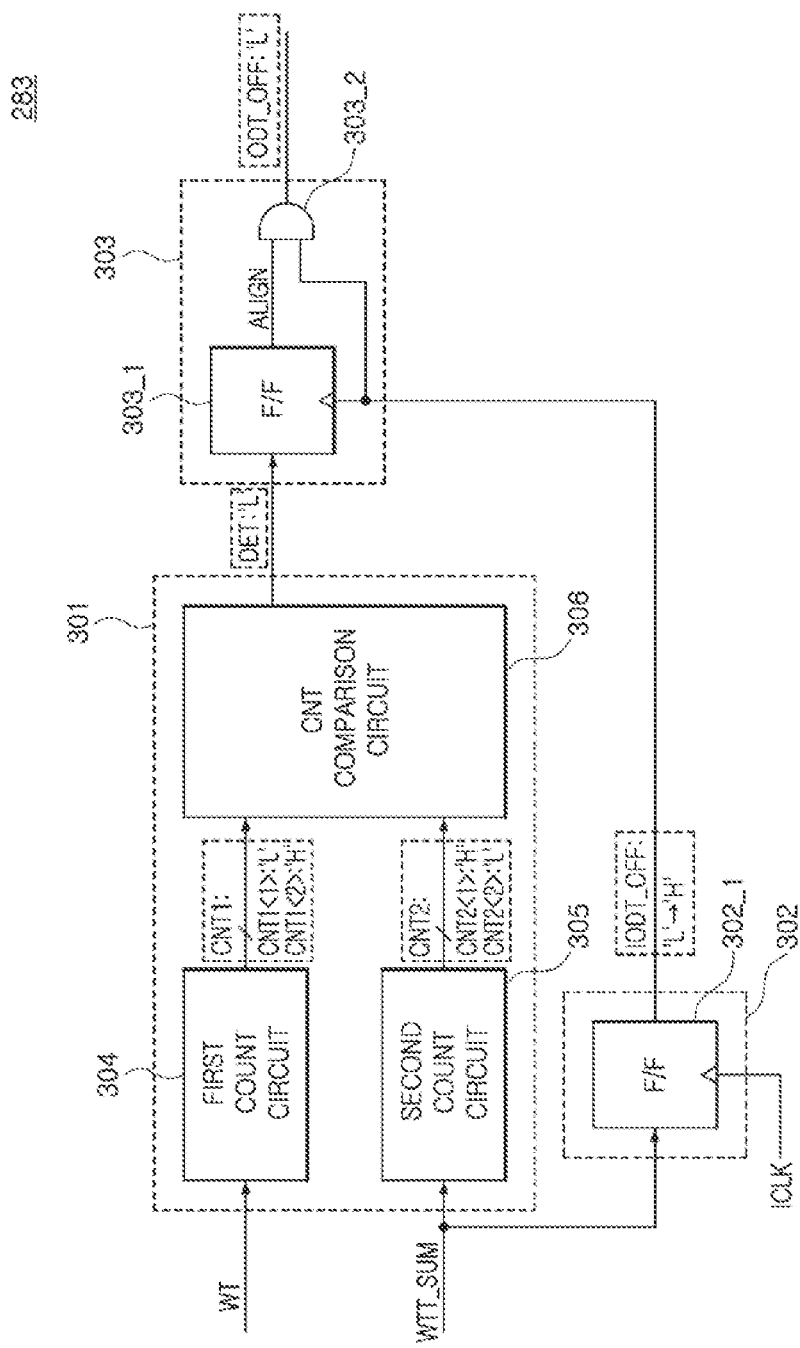

FIG. 22 is a timing diagram illustrating the termination operation when the write command WT is inputted during the set detection period of the write operation performed by the electronic device 120. FIG. 23 illustrates an operation of the termination-off signal generation circuit 283 at a point in time "T33" of FIG. 22.

Referring to FIG. 22, the write clock generation circuit 201 may generate the internal clock signal ICLK, the inverted internal clock signal ICLKB, and the write clock signal WCLK based on the clock signal CLK.

At a point in time "T21", the command generation circuit 203 may generate the write command WT for the first write operation based on the chip selection signal CS and the command/address signal CA.

At the point in time "T21", the first count circuit (304 of FIG. 15) may generate the first bit (CNT1<1> of FIG. 15) of the first count signal CNT1 which is activated to have a logic "high" level when the write command WT for the first write operation is inputted to the first count circuit 304.

At the point in time "T21", the count comparison circuit (306 of FIG. 14) may generate the detection signal DET which is inactivated to have a logic "low" level when the first count signal (CNT1 of FIG. 14) and the second count signal (CNT2 of FIG. 14) have different logic levels.

At a point in time "T22", the command generation circuit 203 may delay the write command WT for the first write operation by one cycle of the internal clock signal ICLK to generate the first internal write signal (IWT1 of FIG. 4) for the first write operation.

At a point in time "T23", the command generation circuit 203 may delay the first internal write signal (IWT1 of FIG. 4) for the first write operation by one cycle of the internal clock signal ICLK to generate the second internal write signal (IWT2 of FIG. 4) for the first write operation.

At a point in time "T24", the command generation circuit 203 may delay the second internal write signal (IWT2 of FIG. 4) for the first write operation by one cycle of the internal clock signal ICLK to generate the write signal EWT for the first write operation.

At a point in time "T25", the command generation circuit 203 may generate the write command WT for the second write operation based on the chip selection signal CS and the command/address signal CA.

At the point in time "T25", the first count circuit (304 of FIG. 15) may generate the first bit (CNT1<1> of FIG. 15) of the first count signal CNT1 which is activated to have a logic "low" level and the second bit (CNT1<2> of FIG. 15) of the first count signal CNT1 which is activated to have a logic "high" level, when the write command WT for the second write operation is inputted to the first count circuit 304.

At a point in time "T26", the command generation circuit 203 may delay the write command WT for the second write operation by one cycle of the internal clock signal ICLK to generate the first internal write signal (IWT1 of FIG. 4) for the second write operation.

At a point in time "T27", the command generation circuit 203 may delay the first internal write signal (IWT1 of FIG. 4) for the second write operation by one cycle of the internal clock signal ICLK to generate the second internal write signal (IWT2 of FIG. 4) for the second write operation.

At a point in time "T28", the command generation circuit 203 may delay the second internal write signal (IWT2 of FIG. 4) for the second write operation by one cycle of the internal clock signal ICLK to generate the write signal EWT for the second write operation.

At a point in time "T31", the termination control circuit 209 may output one of the plurality of internal latency write signals IWLWT, which are generated by delaying the write signal EWT for the first write operation by a set-on period "td21", as the termination-on signal (ODT_ON of FIG. 12) based on the set code SCD.

At the point in time "T31", the termination control circuit 209 may generate the termination enablement signal ODTEN which is activated to have a logic "high" level based on the termination-on signal (ODT_ON of FIG. 12).

At a point in time "T32", the write shift circuit 207 may delay the write signal EWT for the first write operation by a period "td23", which corresponds to a sum of the write latency period and the burst length period, to generate the synthesis write flag signal WTT_SUM for the first write operation.

At the point in time "T32", the second count circuit (305 of FIG. 16) may generate the first bit (CNT2<1> of FIG. 16) of the second count signal CNT2 which is activated to have a logic "high" level when the synthesis write flag signal WTT_SUM for the first write operation is inputted to the second count circuit 305.

At the point in time "T32", the count comparison circuit (306 of FIG. 14) may maintain the detection signal DET which is inactivated to have a logic "low" level when the first count signal (CNT1 of FIG. 14) and the second count signal (CNT2 of FIG. 14) have different logic levels.

Referring to FIGS. 22 and 23, at a point in time "T33", the first bit CNT1<1> of the first count signal CNT1 may have an inactivated state of a logic "low(L)" level and the second bit CNT1<2> of the first count signal CNT1 may have an activated state of a logic "high(H)" level.

At the point in time "T33", the first bit CNT2<1> of the second count signal CNT2 may have an activated state of a logic "high(H)" level and the second bit CNT2<2> of the second count signal CNT2 may have an inactivated state of a logic "low(L)" level.

At the point in time "T33", the detection signal DET may have an inactivated state of a logic "low(L)" level.

At the point in time "T33", the internal delay circuit 302 may delay the synthesis write flag signal WTT_SUM for the first write operation by a set-off period "td25" to generate the internal termination-off signal IODT_OFF which is activated to have a logic "high(H)" level.

At the point in time "T33", the termination-off signal output circuit 303 may maintain the termination-off signal ODT_OFF, which is inactivated to have a logic "low(L)" level, based on the detection signal DET which is inactivated.

Referring to FIG. 22, at a point in time "T34", the termination control circuit 209 may output one of the plurality of internal latency write signals IWLWT, which are generated by delaying the write signal EWT for the second write operation by the set-on period "td21", as the termination-on signal (ODT_ON of FIG. 12) based on the set code SCD.

At the point in time "T34", the termination control circuit 209 may maintain the termination enablement signal ODTEN which is activated to have a logic "high" level, when the termination-on signal (ODT_ON of FIG. 12) which is activated.

At a point in time "T35", the write shift circuit 207 may delay the write signal EWT for the second write operation by the period "td23", which corresponds to a sum of the write latency period and the burst length period, to generate the synthesis write flag signal WTT_SUM for the second write operation.

At the point in time "T35", the second count circuit (305 of FIG. 16) may generate the first bit (CNT2<1> of FIG. 16) of the second count signal CNT2 which is inactivated to have a logic "low" level and the second bit (CNT2<2> of FIG. 16) of the second count signal CNT2 which is activated to have a logic "high" level, when the synthesis write flag signal WTT_SUM for the second write operation is inputted to the second count circuit 305.

At the point in time "T35", the count comparison circuit (306 of FIG. 14) may generate the detection signal DET which is activated to have a logic "high" level when the first count signal (CNT1 of FIG. 14) and the second count signal (CNT2 of FIG. 14) have the same logic level.

Figure 24:
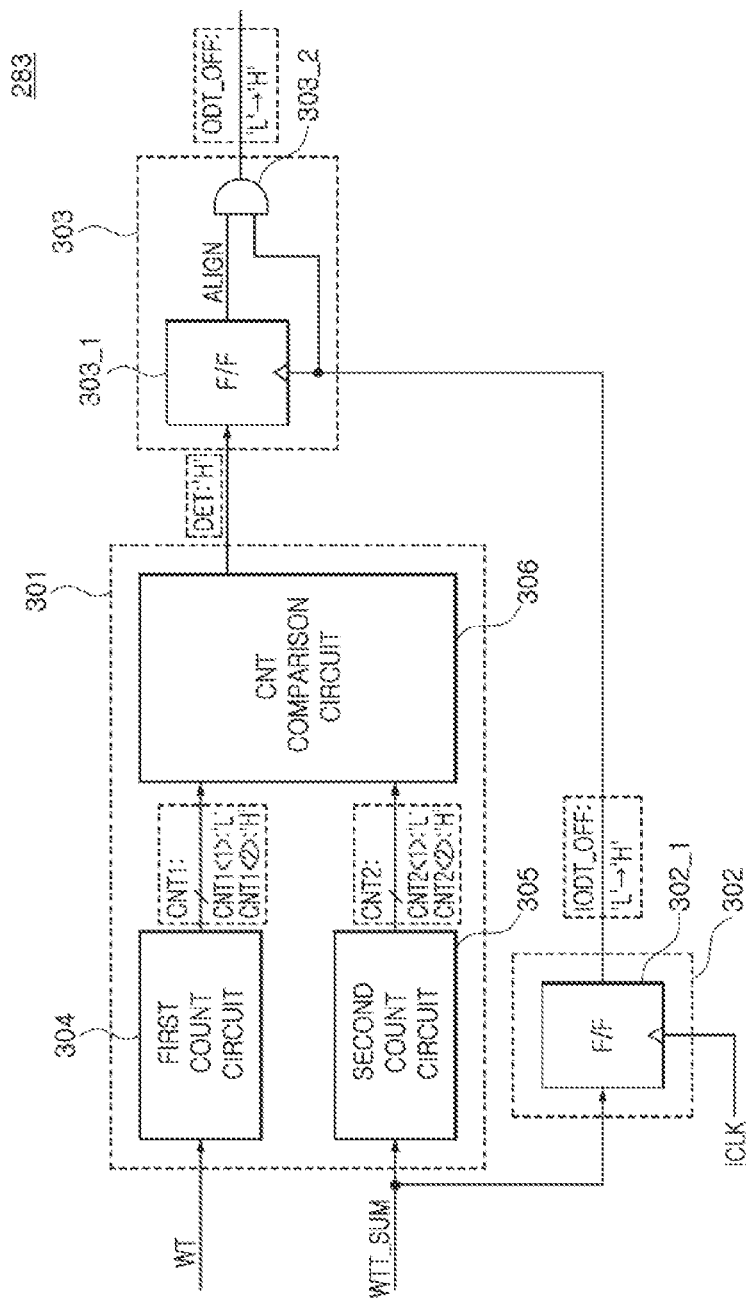

Referring to FIGS. 22 and 24, at a point in time "T36", the first bit CNT1<1> of the first count signal CNT1 may have an inactivated state of a logic "low(L)" level and the second bit CNT1<2> of the first count signal CNT1 may have an activated state of a logic "high(H)" level.

At the point in time "T36", the first bit CNT2<1> of the second count signal CNT2 may have an inactivated state of a logic "low(L)" level and the second bit CNT2<2> of the second count signal CNT2 may have an activated state of a logic "high(H)" level.

At the point in time "T36", the detection signal DET may have an activated state of a logic "high(H)" level.

At the point in time "T36", the internal delay circuit 302 may delay the synthesis write flag signal WTT_SUM for the second write operation by the set-off period "td25" to generate the internal termination-off signal IODT_OFF which is activated to have a logic "high(H)" level.

At the point in time "T36", the termination-off signal output circuit 303 may generate the termination-off signal ODT_OFF which is activated to have a logic "high(H)" level based on the internal termination-off signal IODT_OFF when the detection signal DET is activated.

Referring to FIG. 22, at the point in time "T36", the termination control circuit 209 may inactivate the termination enablement signal ODTEN based on the termination-off signal (ODT_OFF of FIG. 12) which is activated.

Figure 25:
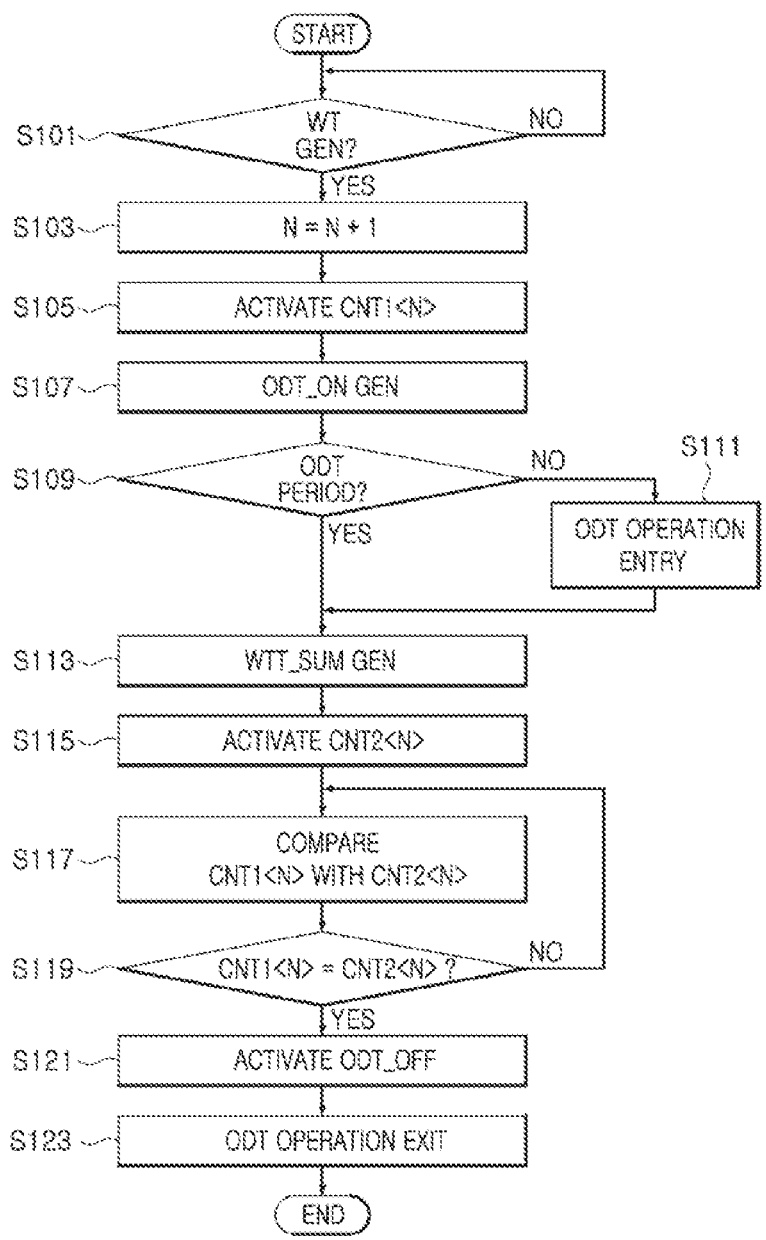
FIG. 25 is a flowchart illustrating a termination operation performed by the electronic device illustrated in FIG. 2.

FIG. 25 is a flowchart illustrating the termination operation when the electronic device 120 of FIG. 2 successively performs the write operation.

At a step S101, generation of the write command WT may be verified to determine the execution or non-execution of the write operation. Whenever the command generation circuit 203 generates the write command WT, the write operation may be performed.

At a step S103, whenever the write command WT is generated, a number "N" may increases by "1" (where, the number "N" may be set to be "0" as an initial value).

At a step S105, the first count circuit 304 may activate the $N^{th}$ bit CNT1<N> of the first count signal CNT1 whenever the write command WT is inputted.

At a step S107, the termination-on signal generation circuit 281 may generate the termination-on signal ODT_ON at an end point in time of the set-on period based on the write command WT.

At a step S109, whether the termination operation is performed may be verified.

When the termination operation is not performed at the step S109, the termination control circuit 209 may activate the termination enablement signal ODTEN based on the termination-on signal ODT_ON to perform the termination operation (see a step S111).

When the termination operation is performed at the step S109, the write shift circuit 207 may delay the write signal EWT, which is generated by delaying the write command WT, by a period corresponding to a sum of the write latency period and the burst length period to generate the synthesis write flag signal WTT_SUM (see a step S113).

At a step S115, the second count circuit 305 may activate the $N^{th}$ bit CNT2<N> of the second count signal CNT2 whenever the synthesis write flag signal WTT_SUM is inputted.

At a step S117, the count comparison circuit 306 may compare the $N^{th}$ bit CNT1<N> of the first count signal CNT1 with the $N^{th}$ bit CNT2<N> of the second count signal CNT2.

At a step S119, a logic level of the $N^{th}$ bit CNT1<N> of the first count signal CNT1 may be compared with a logic level of the $N^{th}$ bit CNT2<N> of the second count signal CNT2. If the $N^{th}$ bit CNT1<N> of the first count signal CNT1 and the $N^{th}$ bit CNT2<N> of the second count signal CNT2 have different logic levels at the step S119, the step 117 and the step 119 may be iteratively executed until the $N^{th}$ bit CNT1<N> of the first count signal CNT1 and the $N^{th}$ bit CNT2<N> of the second count signal CNT2 have the same logic level.

When the $N^{th}$ bit CNT1<N> of the first count signal CNT1 and the $N^{th}$ bit CNT2<N> of the second count signal CNT2 have the same logic level at the step S119, the termination control circuit 209 may activate the termination-off signal ODT_OFF (see a step S121).

At a step S123, the termination control circuit 209 may inactivate the termination enablement signal ODTEN based on the activated termination-off signal ODT_OFF to terminate the termination operation.

As described above, the electronic device 120 may generate the termination enablement signal ODTEN which is activated during the termination operation period for activating the termination resistor when the write operation is performed and may adjust a period that the termination enablement signal ODTEN is activated according to whether the write command WT is inputted during the set detection period of the write operation. Thus, it may be possible to reduce the power consumption of a circuit adjusting the termination operation period when the electronic device 120 successively performs the write operation.

Figure 26:
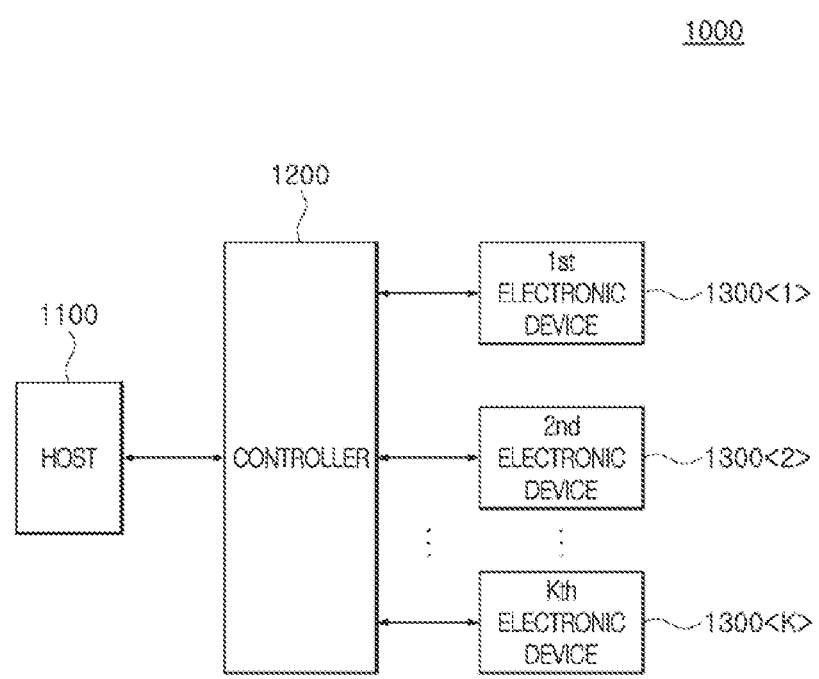
FIG. 26 is a block diagram illustrating a configuration of an electronic system according to another embodiment of the present disclosure.

FIG. 26 is a block diagram illustrating a configuration of an electronic system 1000 according to another embodiment of the present disclosure. As illustrated in FIG. 26, the electronic system 1000 may include a host 1100, a controller 1200, and first to $K^{th}$ electronic devices 1300<1:K> (where, "K" is a natural number which is equal to or greater than three). The controller 1200 may be realized using the controller 110 illustrated in FIG. 1. Each of the first to $K^{th}$ electronic devices 1300<1:K> may be realized using the electronic device 120 illustrated in FIG. 1.

The host 1100 and the controller 1200 may transmit signals to each other using an interface protocol. The interface protocol used for communication between the host 1100 and the controller 1200 may include any one of various interface protocols such as a multi-media card (MMC), an enhanced small device interface (ESDI), an integrated drive electronics (IDE), a peripheral component interconnect-express (PCI-E), an advanced technology attachment (ATA), a serial ATA (SATA), a parallel ATA (PATA), a serial attached SCSI (SAS), and a universal serial bus (USB).

The controller 1200 may control the first to $K^{th}$ electronic devices 1300<1:K> such that each of the first to $K^{th}$ electronic devices 1300<1:K> performs various internal operations including a termination operation included in a write operation.

Each of the first to $K^{th}$ electronic devices 1300<1:K> may generate the termination enablement signal ODTEN which is activated during the termination operation period for activating the termination resistor when the write operation is performed and may adjust a period that the termination enablement signal ODTEN is activated according to whether the write command WT is inputted during the set detection period of the write operation. Thus, it may be possible to reduce the power consumption of a circuit adjusting the termination operation period when the write operations are successively performed.

In some embodiments, each of the first to $K^{th}$ electronic devices 1300<1:K> may be realized using one of a dynamic random access memory (DRAM), a phase change random access memory (PRAM), a resistive random access memory (RRAM), a magnetic random access memory (MRAM), and a ferroelectric random access memory (FRAM).

What is claimed is:

1. An electronic device comprising:
a termination control circuit configured to:
generate a termination enablement signal which is activated during a termination operation period for activating a termination resistor while a write operation is performed; and
adjust a period that the termination enablement signal is activated according to whether a write command is inputted to the termination control circuit during a set detection period of the write operation; and
a data input/output (I/O) circuit configured to receive data by activating the termination resistor during a period that the termination enablement signal is activated when the write operation is performed.

2. The electronic device of claim 1,
wherein the set detection period is set as a period from a point in time when the write command for the write operation is activated until a point in time when an internal termination-off signal is activated during the write operation; and
wherein the internal termination-off signal is generated by delaying a write signal, which is generated based on the write command for the write operation, by a period including a write latency period and a burst length period.

3. The electronic device of claim 1, wherein the termination control circuit is configured to maintain the termination enablement signal which is activated when the write command is not inputted to the termination control circuit during the set detection period.

4. The electronic device of claim 1,
wherein the write operation includes a first write operation and a second write operation;
wherein the first and second write operations are sequentially and successively performed; and
wherein the termination control circuit is configured to adjust an activation period of the termination enablement signal to be longer until a point in time when an internal termination-off signal is activated during the second write operation, when the write command for the second write operation is inputted to the termination control circuit during the set detection period of the first write operation.

5. The electronic device of claim 1, wherein the termination control circuit includes:
a termination-on signal generation circuit configured to output one of first and second internal latency write signals as a termination-on signal according to a logic level combination of a set code;
a termination-off signal generation circuit configured to compare a number of times the write command is input with a number of times of a synthesis write flag signal is input to generate a termination-off signal; and a termination enablement signal generation circuit configured to generate the termination enablement signal based on the termination-on signal and the termination-off signal.

6. The electronic device of claim 5,
wherein a first bit of the set code is activated when a difference between a write latency period and a set-on period is equal to a first set standby period;
wherein a second bit of the set code is activated when a difference between the write latency period and the set-on period is equal to a second set standby period; and
wherein the set-on period varies according to the write latency period and a logic level combination of an internal set code.

7. The electronic device of claim 6, further comprising a write shift circuit configured to:
delay a write signal, which is generated based on the write command, by a period less than the write latency period by the first set standby period to generate the first internal latency write signal; and
delay the write signal by a period less than the write latency period by the second set standby period to generate the second internal latency write signal.

8. The electronic device of claim 7, wherein the termination-on signal generation circuit is configured to:
output the first internal latency write signal as the termination-on signal when the first bit of the set code is activated; and
output the second internal latency write signal as the termination-on signal when the second bit of the set code is activated.

9. The electronic device of claim 5, wherein the synthesis write flag signal is generated by delaying a write signal, which is generated based on the write command, by a period corresponding to a sum of a write latency period and a burst length period.

10. The electronic device of claim 5, wherein the termination-off signal generation circuit is configured to:
activate the termination-off signal when the number of times the write command is input is equal to the number of times the synthesis write flag signal is input; and
inactivate the termination-off signal when the number of times the write command is input is greater than the number of times the synthesis write flag signal is input.

11. The electronic device of claim 5, wherein the termination-off signal generation circuit includes:
a detection circuit configured to generate a detection signal which is activated when the number of times the write command is input is equal to the number of times the synthesis write flag signal is input;
an internal delay circuit configured to delay the synthesis write flag signal by an end delay period to generate an internal termination-off signal; and
a termination-off signal output circuit configured to output the internal termination-off signal as the termination-off signal when the detection signal is activated.

12. The electronic device of claim 11, wherein the detection circuit includes:
a first count circuit configured to sequentially activate a plurality of bits included in a first count signal whenever the write command is inputted to the first count circuit;
a second count circuit configured to sequentially activate a plurality of bits included in a second count signal whenever the synthesis write flag signal is inputted to the second count circuit; and a count comparison circuit configured to activate the detection signal when the first count signal and the second count signal have the same logic level.

13. The electronic device of claim 5, wherein the termination enablement signal generation circuit is configured to:
activate the termination enablement signal when the termination-on signal is activated; and
inactivate the termination enablement signal when the termination-off signal is activated.

14. An electronic device comprising:
a termination-on signal generation circuit configured to generate a termination-on signal whenever a write operation is performed;
a termination-off signal generation circuit configured to:
generate a detection signal and an internal termination-off signal when the write operation is performed; and
generate a termination-off signal from the internal termination-off signal based on the detection signal; and
a termination enablement signal generation circuit configured to generate a termination enablement signal which is activated during an activation period of a termination resistor based on the termination-on signal and the termination-off signal.

15. The electronic device of claim 14, wherein the termination-off signal generation circuit is configured to activate the detection signal when a write command is not inputted to the termination-off signal generation circuit during a set detection period of the write operation.

16. The electronic device of claim 15, wherein the set detection period is set as a period from a point in time when the write command for the write operation is activated until a point in time when the internal termination-off signal is activated during the write operation.

17. The electronic device of claim 14, wherein the internal termination-off signal is generated by delaying a write signal, which is generated based on a write command for the write operation, by a period including a write latency period and a burst length period.

18. The electronic device of claim 14,
wherein the write operation includes a first write operation and a second write operation;
wherein the first and second write operations are sequentially and successively performed; and
wherein the termination-off signal generation circuit is configured to maintain the termination-off signal having an inactivated state until a point in time when the internal termination-off signal is activated during the second write operation, when a write command for the second write operation is inputted to the termination-off signal generation circuit during a set detection period of the first write operation.

19. The electronic device of claim 14, wherein the termination enablement signal generation circuit is configured to:
activate the termination enablement signal when the termination-on signal is activated; and
inactivate the termination enablement signal when the termination-off signal is activated.

20. The electronic device of claim 14,
wherein the write operation includes a first write operation and a second write operation;
wherein the first and second write operations are sequentially and successively performed; and
wherein the termination enablement signal generation circuit is configured to activate the termination enablement signal when the termination-on signal is activated during the first write operation; and wherein the termination enablement signal generation circuit is configured to maintain the termination enablement signal having an activated state until a point in time when the internal termination-off signal is activated during the second write operation, when the termination-on signal is activated during a set detection period of the first write operation when the second write operation is performed.

* * * * *